(12) United States Patent
Misaki

(10) Patent No.: US 11,011,570 B2
(45) Date of Patent: May 18, 2021

(54) IMAGING PANEL AND METHOD FOR MANUFACTURING SAME

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/528,951

(22) Filed: Aug. 1, 2019

(65) Prior Publication Data

US 2020/0043973 A1    Feb. 6, 2020

Related U.S. Application Data

(60) Provisional application No. 62/713,884, filed on Aug. 2, 2018.

(51) Int. Cl.
*H01L 27/146* (2006.01)

(52) U.S. Cl.
CPC .... *H01L 27/14685* (2013.01); *H01L 27/1462* (2013.01); *H01L 27/14603* (2013.01); *H01L 27/14663* (2013.01); *H01L 27/14692* (2013.01); *H01L 27/14612* (2013.01)

(58) Field of Classification Search
CPC ......... H01L 27/14685; H01L 27/14603; H01L 27/1462; H01L 27/14663; H01L 27/14692; H01L 27/14612; H01L 27/14643–14663; H01L 27/146–14893; H01L 27/14665–14676; H01L 27/1461; H01L 27/14683
See application file for complete search history.

(56) References Cited

U.S. PATENT DOCUMENTS

| | | | |
|---|---|---|---|
| 2010/0124804 A1* | 5/2010 | Takahashi | H01L 29/78678 438/158 |
| 2014/0091203 A1* | 4/2014 | Fujiyoshi | A61B 6/563 250/208.1 |
| 2014/0103347 A1* | 4/2014 | Ishino | H01L 27/14689 257/59 |
| 2017/0357011 A1* | 12/2017 | Tomiyasu | G01N 23/04 |

FOREIGN PATENT DOCUMENTS

| | | |
|---|---|---|
| JP | 2011-159781 A | 8/2011 |
| JP | 2014-078651 A | 5/2014 |

* cited by examiner

*Primary Examiner* — Shahed Ahmed
(74) *Attorney, Agent, or Firm* — ScienBiziP, P.C.

(57) ABSTRACT

An imaging panel includes a photoelectric conversion layer on a side of one of surfaces of a substrate. Further, the imaging panel includes an electrode connected to one of surfaces of the photoelectric conversion layer, a bias line connected with the electrode, and a protection film that is made of a material resistant against an etching agent containing hydrofluoric acid, and covers side surfaces of the bias line.

5 Claims, 29 Drawing Sheets

IMAGING PANEL AND METHOD FOR MANUFACTURING SAME

TECHNICAL FIELD

The present invention relates to an imaging panel and a method for producing the same.

BACKGROUND ART

An X-ray imaging device that picks up an X-ray image with an imaging panel that includes a plurality of pixel portions is known. In such an X-ray imaging device, for example, p-intrinsic-n (PIN) photodiodes are used as photoelectric conversion elements, and irradiated X-rays are converted into charges by the PIN photodiodes. Converted charges are read out by thin film transistors (hereinafter also referred to as TFTs) that are caused to operate, the TFTs being provided in the pixel portions. With the charges thus read out, an X-ray image is obtained. JP-A-2014-078651 discloses a photoelectric conversion element array unit in which such PIN photodiodes are used.

Incidentally, a bias line is connected to the anode electrode of the PIN photodiode, and a bias voltage is applied to the anode electrode through the bias line. If the bias line has a high resistance, the bias voltage is not applied appropriately to the PIN photodiode, which causes the performance of the device as an X-ray sensor to decrease. The thinner line width of the bias line than a desired line width, which occurs in the steps for producing the imaging panel, can be considered as a cause that increase the resistance of the bias line. In other words, for example, in a case where the bias line is exposed to hydrofluoric acid or the like in a step after the bias line is formed, if the material of the bias line is not resistant against hydrofluoric acid or the like, the bias line is etched by hydrofluoric acid or the like, and tends to have a smaller line width and a higher line resistance.

SUMMARY OF THE INVENTION

An imaging panel made in light of the above-described problem includes: a substrate; a photoelectric conversion layer provided on a side of one of surfaces of the substrate; an electrode in contact with one of surfaces of the photoelectric conversion layer; a bias line connected with the electrode; and a protection film that is made of a material resistant against an etching agent containing hydrofluoric acid, and covers side surfaces of the bias line.

With the above-described configuration, a bias voltage can be appropriately applied to the photoelectric conversion element.

MODE FOR CARRYING OUT THE INVENTION

Figure 1:
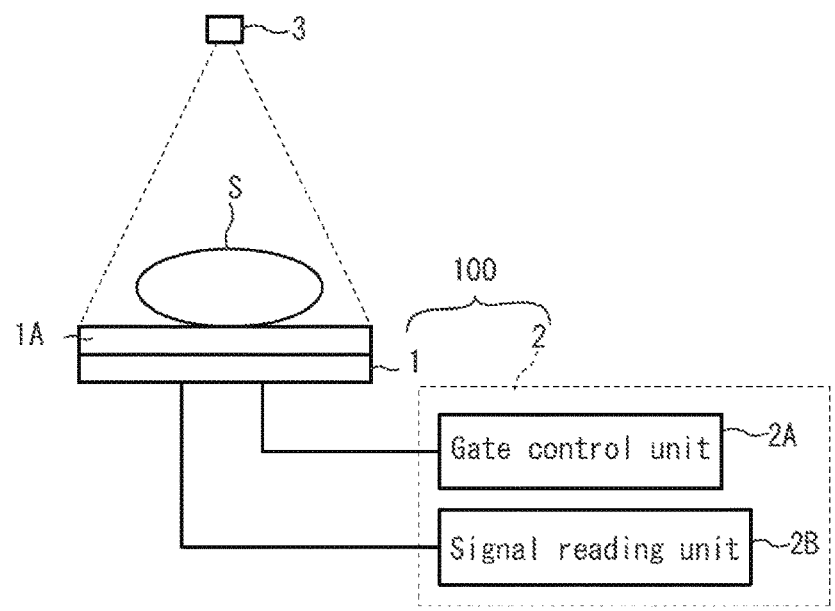
FIG. 1 schematically shows an X-ray imaging device in Embodiment 1.

The following description describes embodiments of the present invention in detail, while referring to the drawings. Identical or equivalent parts in the drawings are denoted by the same reference numerals, and the descriptions of the same are not repeated.

Embodiment 1

(Configuration)
FIG. 1 is a schematic diagram showing an X-ray imaging device in the present embodiment. The X-ray imaging device 100 includes an imaging panel 1 and a control unit 2. The control unit 2 includes a gate control unit 2A and a signal reading unit 2B. X-rays are irradiated from the X-ray source 3 to an object S, and X-rays transmitted through the object S are converted into fluorescence (hereinafter referred to as scintillation light) by a scintillator 1A provided above the imaging panel 1. The X-ray imaging device 100 acquires an X-ray image by picking up the scintillation light with the imaging panel 1 and the control unit 2.

Figure 2:
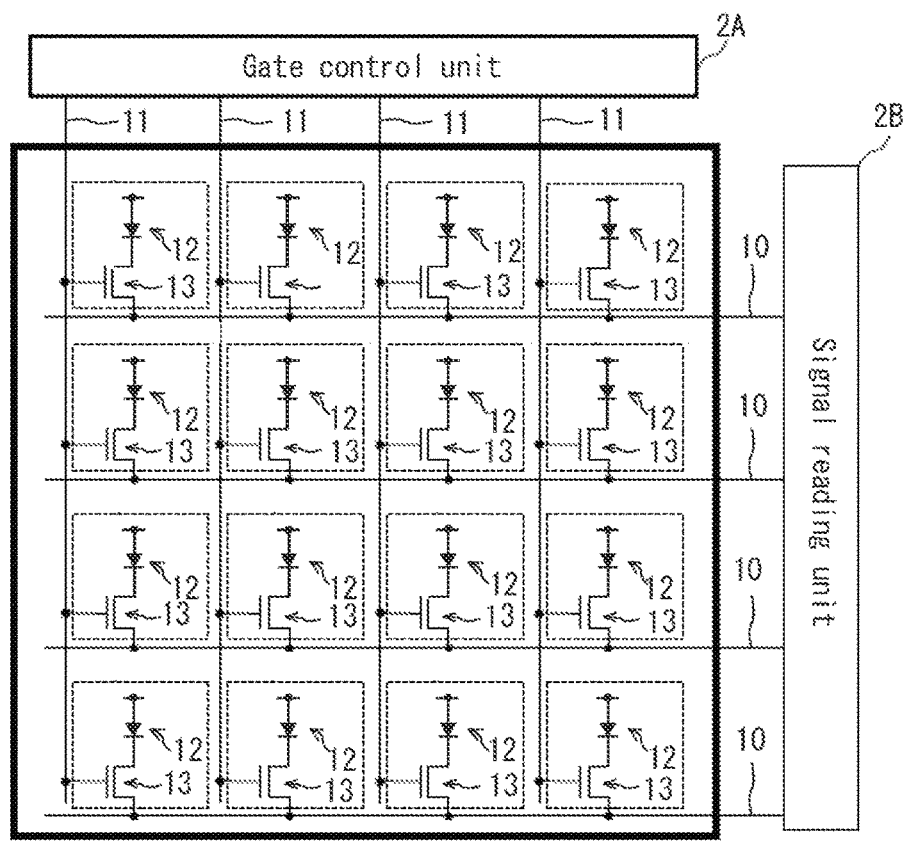
FIG. 2 schematically shows a schematic configuration of an imaging panel shown in FIG. 1.

FIG. 2 is a schematic diagram showing a schematic configuration of the imaging panel 1. As shown in FIG. 2, a plurality of source lines 10, and a plurality of gate lines 11 intersecting with the source lines 10 are formed in the imaging panel 1. The gate lines 11 are connected with the gate control unit 2A, and the source lines 10 are connected with the signal reading unit 2B.

The imaging panel 1 includes TFTs 13 connected to the source lines 10 and the gate lines 11, at positions at which the source lines 10 and the gate lines 11 intersect. Further, photodiodes 12 are provided in areas surrounded by the source lines 10 and the gate lines 11 (hereinafter referred to as pixels). In each pixel, scintillation light obtained by converting X-rays transmitted through the object S is converted by the photodiode 12 into charges according to the amount of the light.

The gate lines 11 in the imaging panel 1 are sequentially switched by the gate control unit 2A into a selected state, and the TFT 13 connected to the gate line 11 in the selected state is turned ON. When the TFT 13 is turned ON, a signal according to the charges obtained by the conversion by the photodiode 12 is output through the source line 10 to the signal reading unit 2B.

Figure 3:
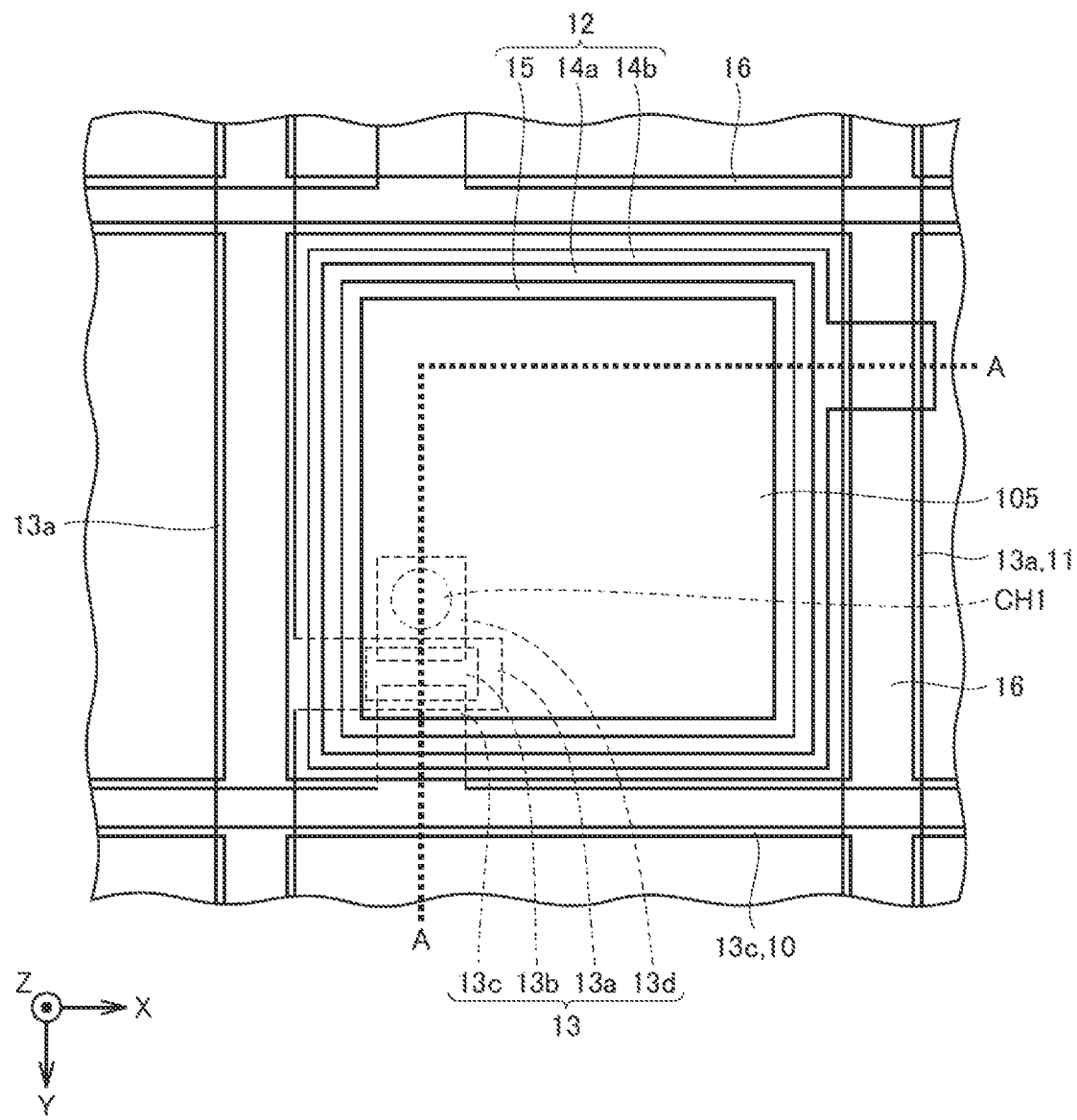
FIG. 3 is an enlarged plan view showing one pixel portion of the imaging panel shown in FIG. 2.

FIG. 3 is an enlarged plan view of one pixel portion of the imaging panel 1 shown in FIG. 2. As shown in FIG. 3, in the pixel surrounded by the gate line 11 and the source line 10, the photodiode 12 and the TFT 13 are arranged. The photodiode 12 includes a lower electrode (cathode) 14a and an upper electrode (anode) 14b as a pair of electrodes, and a photoelectric conversion layer 15. The upper electrode 14b is provided on the photoelectric conversion layer 15, that is, on a side irradiated with X-rays from the X-ray source 3 (see FIG. 1). The TFT13 includes a gate electrode 13a integrated with the gate line 11, a semiconductor active layer 13b, a source electrode 13c integrated with the source line 10, and a drain electrode 13d. Further, a bias line 16 is arranged so as to overlap with the gate line 11 and the source line 10 when viewed in a plan view. The bias line 16 supplies a bias voltage to the photodiode 12. In the pixel, a contact hole CH1 for connecting the drain electrode 13d and the lower electrode 14a is provided.

Figure 4:
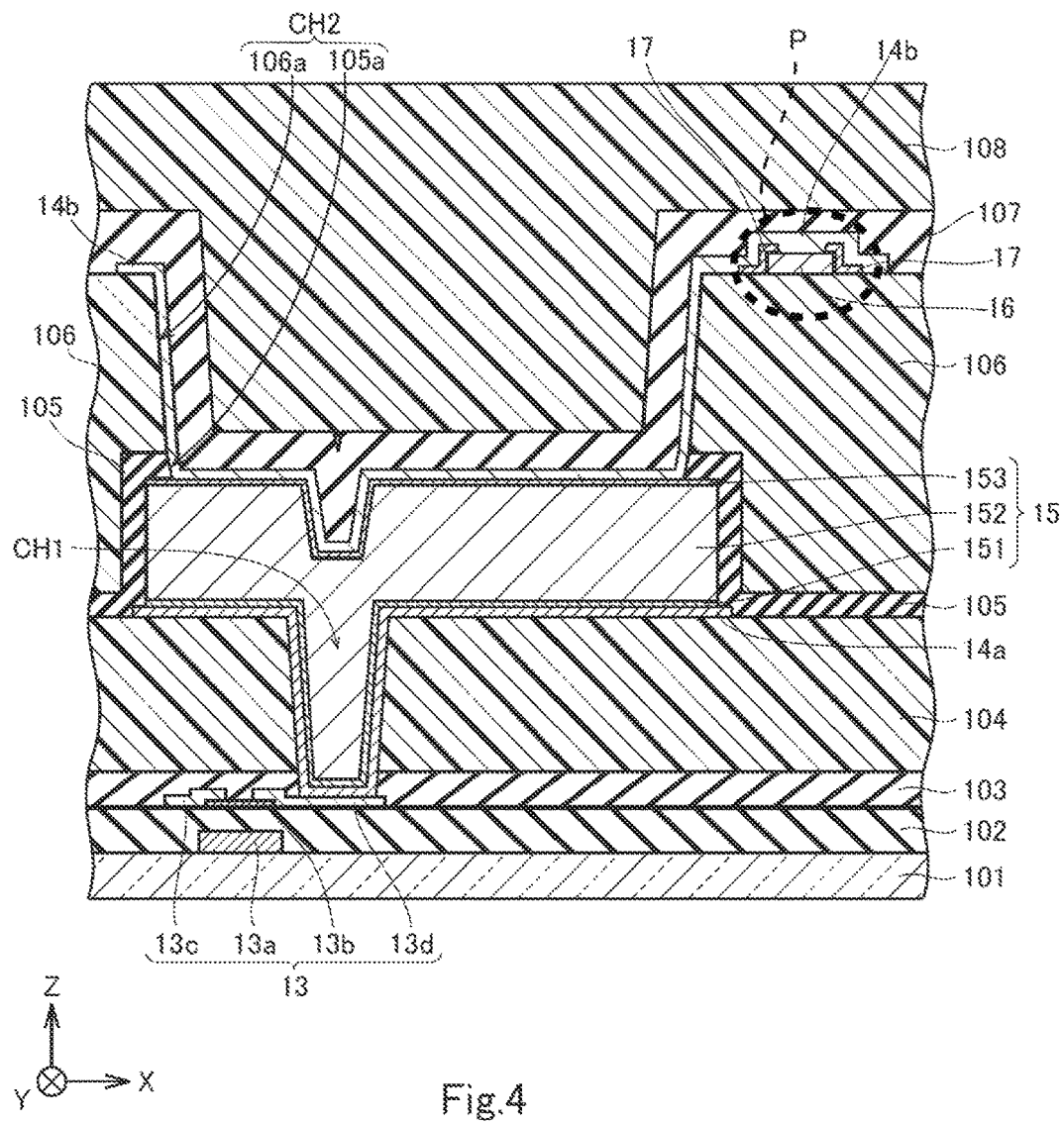
FIG. 4 is a cross-sectional view of the pixel shown in FIG. 3, taken along the line A-A.

Here, FIG. 4 shows a cross section of the pixel shown in FIG. 3, taken along line A-A. In the following description, the Z-axis positive direction side as viewed in FIG. 4, that is, the side on which the X-ray source is provided, is referred to as an upper side, and the Z-axis negative direction side as viewed in FIG. 4 is referred to as a lower side, in some cases.

As shown in FIG. 4, the elements in the pixel are arranged on one of the surfaces of the substrate 101. The substrate 101 is a substrate having an insulating property, which is formed with, for example, a glass substrate.

On the substrate 101, the gate electrode 13a integrated with the gate line 11 (see FIG. 3), and a gate insulating film 102, are formed.

The gate electrode 13a and the gate line 11 are made of, for example, a metal such as aluminum (Al), tungsten (W), molybdenum (Mo), molybdenum nitride (MoN), tantalum (Ta), chromium (Cr), titanium (Ti), or copper (Cu), an alloy of any of these metals, or a metal nitride of these metals. In the present embodiment, the gate electrode 13a and the gate line 11 have a laminate structure in which a metal film made of molybdenum nitride and a metal film made of aluminum are laminated in this order. Regarding thicknesses of these metal films, for example, the metal film made of molybdenum nitride has a thickness of about 100 nm, and the metal film made of aluminum has a thickness of about 300 nm.

The gate insulating film 102 covers the gate electrode 13a. The gate insulating film 102 may be formed with, for example, silicon oxide ($SiO_x$), silicon nitride ($SiN_x$), silicon oxide nitride ($SiO_xN_y$) (x>y), or silicon nitride oxide ($SiN_xO_y$) (x>y). In the present embodiment, the gate insulating film 102 is formed with a laminate film obtained by laminating silicon oxide ($SiO_x$) and silicon nitride ($SiN_x$) in the order, and regarding the thicknesses of these films, the film of silicon oxide ($SiO_x$) has a thickness of about 50 nm, and the film of silicon nitride ($SiN_x$) has a thickness of about 400 nm.

The semiconductor active layer 13b, as well as the source electrode 13c and the drain electrode 13d connected with the semiconductor active layer 13b are formed on the gate electrode 13a with the gate insulating film 102 being interposed therebetween.

The semiconductor active layer 13b is formed in contact with the gate insulating film 102. The semiconductor active layer 13b is made of an oxide semiconductor. For forming the oxide semiconductor, for example, the following material may be used: $InGaO_3(ZnO)_5$; magnesium zinc oxide ($Mg_xZn_{1-x}O$); cadmium zinc oxide ($Cd_xZn_{1-x}O$); cadmium oxide (CdO); or an amorphous oxide semiconductor containing indium (In), gallium (Ga), and zinc (Zn) at a predetermined ratio. In the present embodiment, the semiconductor active layer 13b is made of an amorphous oxide semiconductor containing indium (In), gallium (Ga), and zinc (Zn) at a predetermined ratio, and has a thickness of, for example, about 70 nm.

The source electrode 13c and the drain electrode 13d are arranged on the gate insulating film 102 so as to be in contact with a part of the semiconductor active layer 13b. The source electrode 13c is integrated with the source line 10 (see FIG. 3). The drain electrode 13d is connected with the lower electrode 14a through the contact hole CH1.

The source electrode 13c and the drain electrode 13d are formed in the same layer, and are made of, for example, a metal such as aluminum (Al), tungsten (W), molybdenum (Mo), tantalum (Ta), chromium (Cr), titanium (Ti), or copper (Cu), or alternatively, an alloy of any of these, of a metal nitride of any of these. Further, as the material for the source electrode 13c and the drain electrode 13d, the following material may be used: a material having translucency such as indium tin oxide (ITO), indium zinc oxide (IZO), indium tin oxide (ITSO) containing silicon oxide, indium oxide ($In_2O_3$), tin oxide ($SnO_2$), zinc oxide (ZnO), or titanium nitride; or a material obtained by appropriately combining any of these.

The source electrode 13c and the drain electrode 13d may be, for example, a laminate of a plurality of metal films. More specifically, the source electrode 13c and the drain electrode 13d have a laminate structure in which a metal film made of molybdenum nitride (MoN), a metal film made of aluminum (Al), and a metal film made of molybdenum nitride (MoN) are laminated in this order. Regarding the thicknesses of the films, the metal film in the lower layer, which is made of molybdenum nitride (MoN), has a thickness of about 100 nm, the metal film made of aluminum (Al) has a thickness of about 500 nm, and the metal film in the upper layer, which is made of molybdenum nitride (MoN), has a thickness of about 50 nm.

A first insulating film 103 is provided so as to cover the source electrode 13c and the drain electrode 13d. The first insulating film 103 may have a single layer structure made of silicon oxide ($SiO_2$) or silicon nitride (SiN), or a laminate structure obtained by laminating silicon nitride (SiN) and silicon oxide ($SiO_2$) in this order.

On the first insulating film 103, a second insulating film 104 is formed. On the drain electrode 13d, the contact hole CH1 is formed. The contact hole CH1 passes through the second insulating film 104 and the first insulating film 103. The second insulating film 104 is made of an organic transparent resin, for example, acrylic resin or siloxane-based resin, and has a thickness of, for example, about 2.5 µm.

On the second insulating film 104, the lower electrode 14a is formed. The lower electrode 14a is connected with the drain electrode 13d through the contact hole CH1. The lower electrode 14a is formed with, for example, a metal film containing molybdenum nitride (MoN), and has a thickness of, for example, about 200 nm.

On the lower electrode 14a, the photoelectric conversion layer 15 is formed. The photoelectric conversion layer 15 is composed of the n-type amorphous semiconductor layer 151, the intrinsic amorphous semiconductor layer 152, and the p-type amorphous semiconductor layer 153, which are laminated in the order. In this example, the length of the photoelectric conversion layer 15 in the X-axis direction is shorter than the length of the lower electrode 14a in the X-axis direction.

The n-type amorphous semiconductor layer 151 is made of amorphous silicon doped with an n-type impurity (for example, phosphorus). The n-type amorphous semiconductor layer 151 has a thickness of, for example, about 30 nm.

The intrinsic amorphous semiconductor layer 152 is made of intrinsic amorphous silicon. The intrinsic amorphous semiconductor layer 152 is in contact with the n-type amorphous semiconductor layer 151. The intrinsic amorphous semiconductor layer has a thickness of, for example, about 1000 nm.

The p-type amorphous semiconductor layer 153 is made of amorphous silicon doped with a p-type impurity (for example, boron). The p-type amorphous semiconductor layer 153 is in contact with the intrinsic amorphous semiconductor layer 152. The p-type amorphous semiconductor layer 153 has a thickness of, for example, about 5 nm.

On the second insulating film 104, a third insulating film 105 is provided. The third insulating film 105 covers side surfaces of the lower electrode 14a and the photoelectric conversion layer 15, and has an opening 105a on the photoelectric conversion layer 15. The third insulating film 105 is an inorganic insulating film made of, for example, silicon nitride (SiN), and has a thickness of, for example, about 300 nm.

On the third insulating film 105, a fourth insulating film 106 is provided. The fourth insulating film 106 has an opening 106a at a position that overlaps with the opening 105a in the third insulating film 105 when viewed in a plan view. The openings 105a and 106a composes a contact hole CH2. The fourth insulating film 106 is formed with, for example, an organic insulating film made of an organic transparent resin such as acrylic resin or siloxane-based resin. The fourth insulating film 106 has a thickness of, for example, about 2.5 µm.

Figure 5:
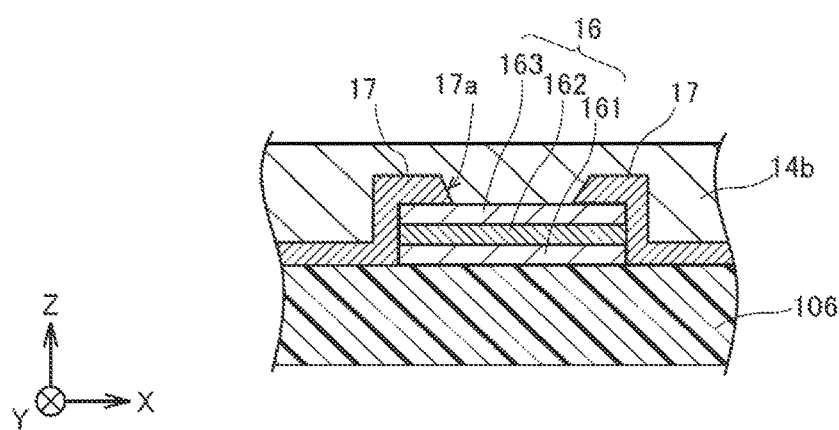
FIG. 5 is an enlarged view showing a broken-line frame portion in FIG. 4.

On the fourth insulating film 106, the bias line 16 is formed. FIG. 5 is an enlarged view schematically showing the portion of the broken-line frame R in FIG. 4. As shown in FIG. 5, the bias line 16 has, for example, a laminate structure obtained by sequentially laminating a metal film 161 made of molybdenum nitride (MoN), a metal film 162 made of aluminum (Al), and a metal film 163 made of titanium (Ti). The films of molybdenum nitride (MoN), aluminum (Al), and titanium (Ti) have thicknesses of, for example, about 100 nm, 300 nm, and 50 nm, respectively.

The bias line 16 is connected with the control unit 2 (see FIG. 1). The bias line 16 applies a bias voltage that is input through the contact hole CH2 from the control unit 2, to the upper electrode 14*b*.

Further, as shown in FIG. 5, on the fourth insulating film 106, a protection film 17 is provided in such a manner that the protection film 17 is separated on the top surface of the bias line 16 and covers the side surfaces of the bias line 16. In this example, the protection film 17 is formed with, for example, a semiconductor film made of amorphous silicon, or an inorganic insulating film made of silicon nitride ($SiN_x$). The protection film 17 has a thickness of, for example, about 100 nm.

Further, as shown in FIG. 4, on the fourth insulating film 106, there is provided an upper electrode 14*b* so that the upper electrode 14*b* covers the p-type amorphous semiconductor layer 153, the bias line 16, and the protection film 17. In this example, the upper electrode 14*b* is formed with a transparent conductive film made of, for example, indium tin oxide (ITO). The upper electrode 14*b* has a thickness of, for example, about 70 nm. The upper electrode 14*b* is connected with the bias line 16 in the opening 17*a* in the protection film 17, and is connected with the p-type amorphous semiconductor layer 153 in the contact hole CH2.

A fifth insulating film 107 is formed so as to cover the fourth insulating film 106 and the upper electrode 14*b*. The fifth insulating film 107 is formed with, for example, an inorganic insulating film made of silicon nitride (SiN). The fifth insulating film 107 has a thickness of, for example, about 200 nm.

On the fifth insulating film 107, a sixth insulating film 108 is provided. The sixth insulating film 108 in this example is formed with an organic insulating film made of, for example, acrylic resin or siloxane-based resin. The sixth insulating film 108 has a thickness of, for example, about 2.0 μm.

(Method for Producing Imaging Panel 1)

Figure 6A:
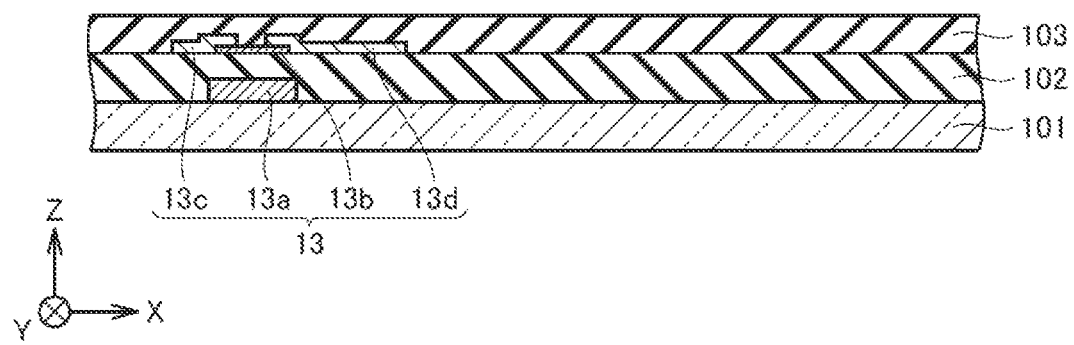
FIG. 6A is a cross-sectional view showing a step in a process for producing the imaging panel shown in FIG. 4, the step being a step of forming a first insulating film, in a state in which a gate insulating film and a TFT are formed on a substrate.
Figure 6B:
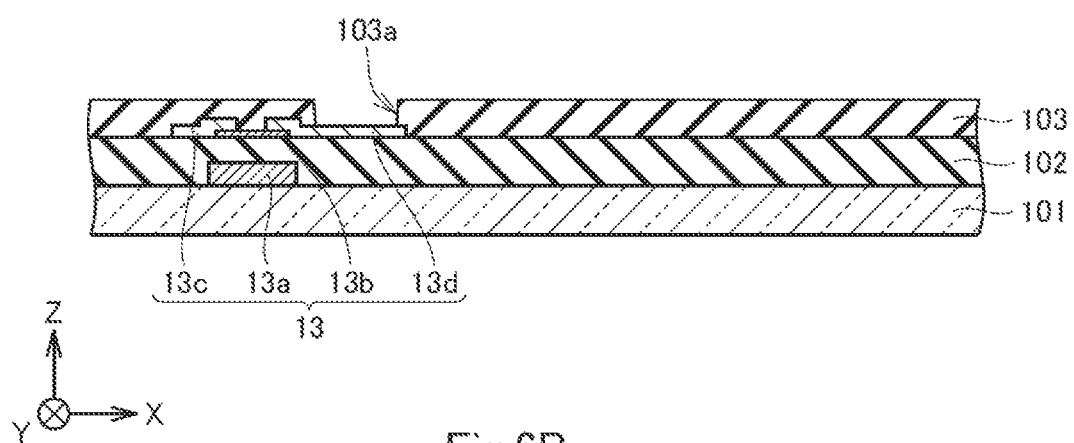
FIG. 6B is a cross-sectional view showing a step of forming an opening in the first insulating film shown in FIG. 6A.

Next, the following description describes a method for producing the imaging panel 1. FIGS. 6A to 6T are cross-sectional views of the pixel in respective steps of the method for producing the imaging panel 1 (taken along line A-A in FIG. 3).

As shown in FIG. 6A, the gate insulating film 102 and the TFT 13 are formed on the substrate 101 by a known method, and the first insulating film 103 made of silicon nitride (SiN) is formed by, for example, plasma CVD, so as to cover the TFT 13.

Subsequently, a heat treatment at about 350° C. is applied to an entire surface of the substrate 101, and photolithography and wet etching are carried out so that the first insulating film 103 is patterned, whereby the opening 103*a* is formed on the drain electrode 13*d* (see FIG. 6B).

Figure 6C:
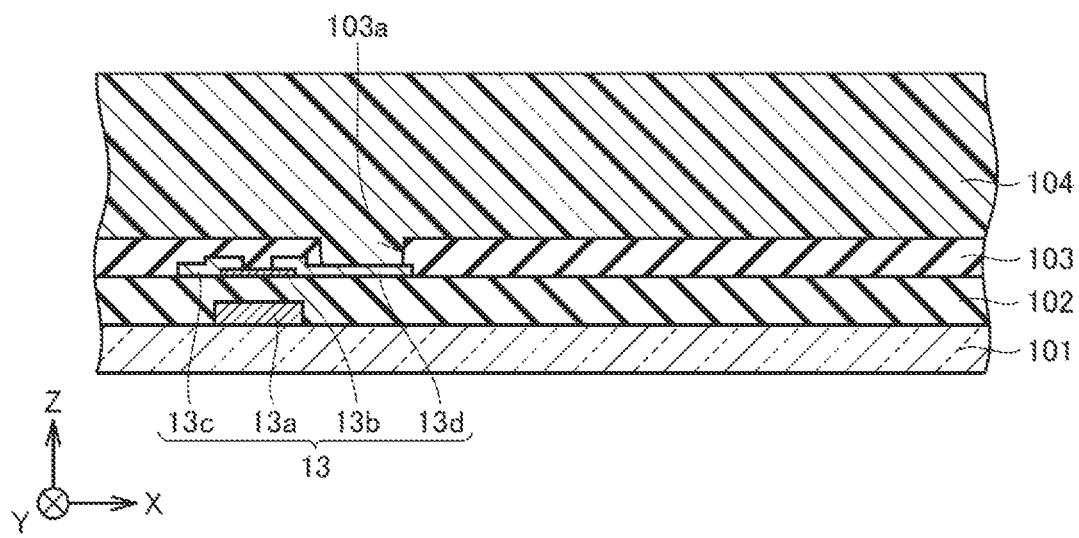
FIG. 6C is a cross-sectional view showing a step of forming a second insulating film on the first insulating film in FIG. 6B.

Next, the second insulating film 104 made of acrylic resin or siloxane-based resin is formed on the first insulating film 103 by, for example, slit coating (see FIG. 6C).

Figure 6D:
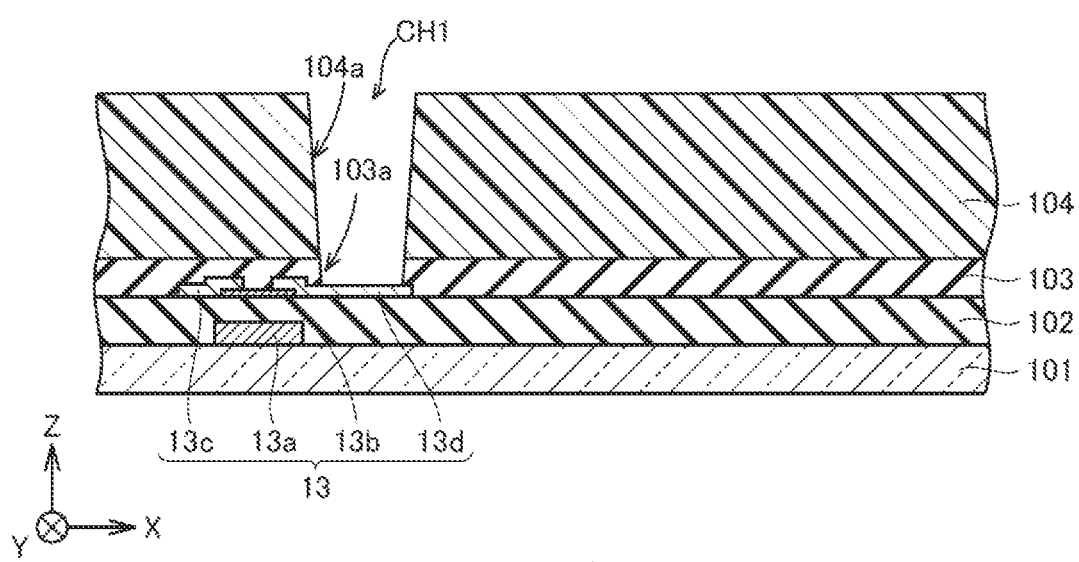
FIG. 6D is a cross-sectional view showing a step of forming an opening in the second insulating film shown in FIG. 6C.

An opening 104*a* of the second insulating film 104 is formed by photolithography on the opening 103*a*. Through these steps, a contact hole CH2 composed of the openings 103*a* and 104*a* is formed (see FIG. 6D).

Figure 6E:
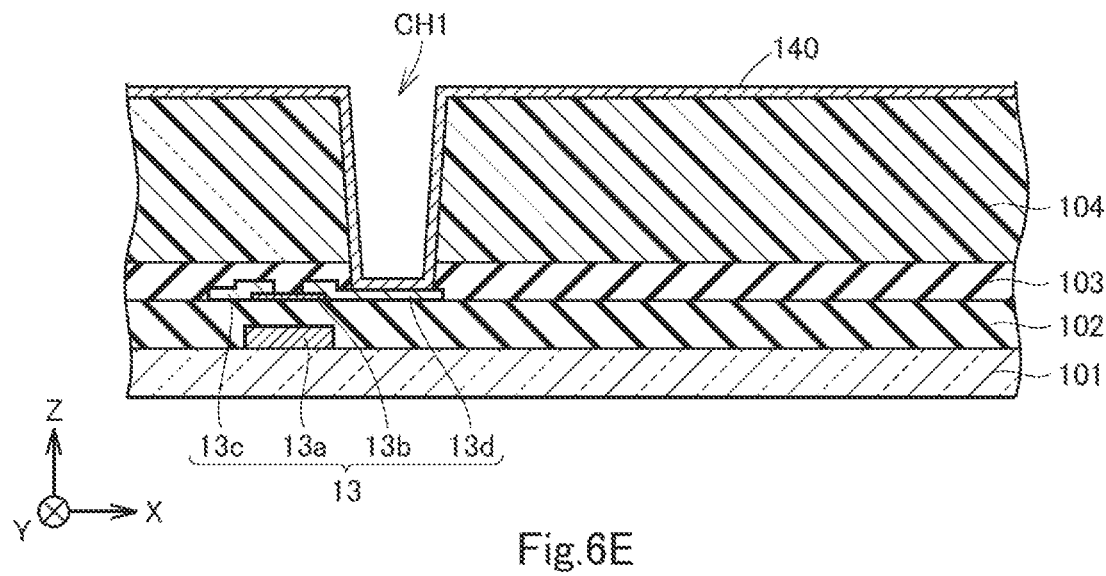
FIG. 6E is a cross-sectional view showing a step of forming a metal film that will become a lower electrode on the second insulating film in FIG. 6D.

Subsequently, a metal film 140 made of molybdenum nitride (MoN) is formed on the second insulating film 104 by, for example, sputtering (see FIG. 6E).

Figure 6F:
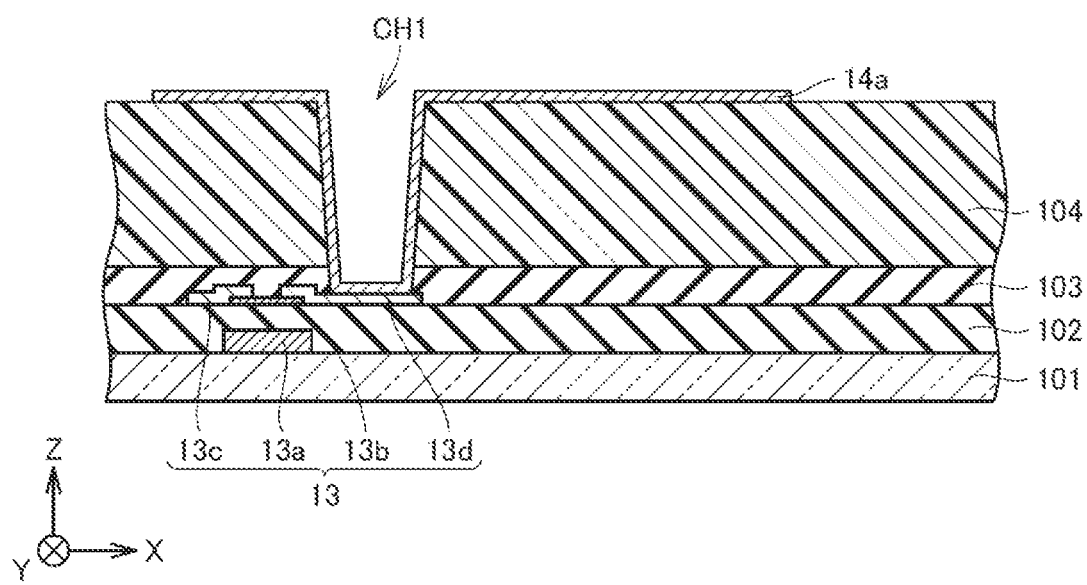
FIG. 6F is a cross-sectional view showing a step of etching the metal film that will become a lower electrode shown in FIG. 6E, so as to form the lower electrode.

Then, photolithography and wet etching are carried out, whereby the metal film 140 is patterned. Through these steps, the lower electrode 14*a*, which is connected with the drain electrode 13*d* through the contact hole CH1, is formed on the second insulating film 104 (see FIG. 6F).

Figure 6G:
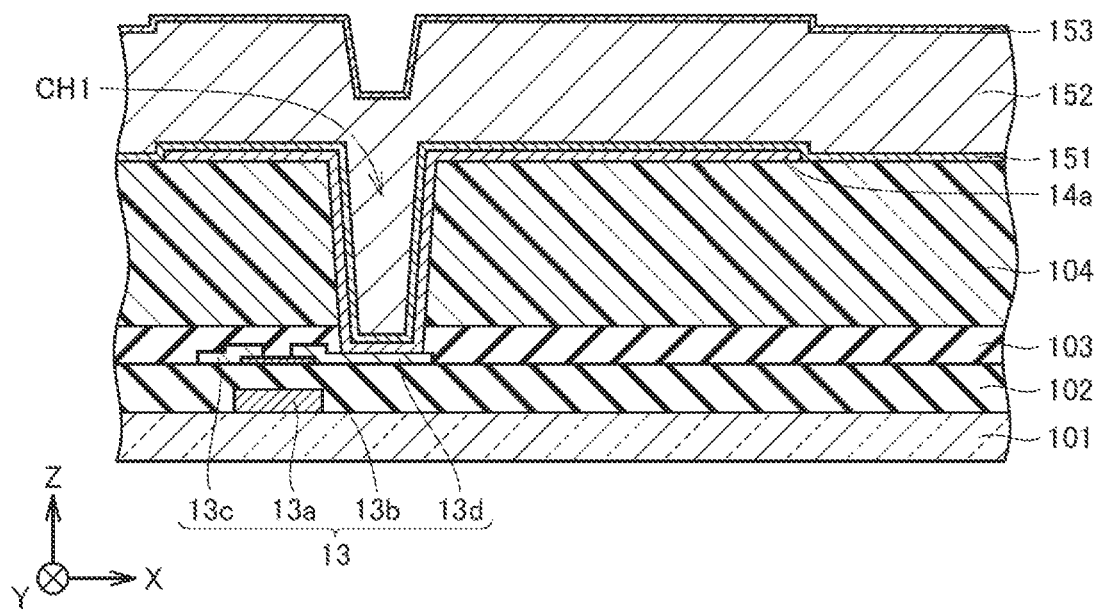
FIG. 6G is a cross-sectional view showing a step of forming an n-type amorphous semiconductor layer, an intrinsic amorphous semiconductor layer, and a p-type amorphous semiconductor layer so that they cover the metal film shown in FIG. 6F.

Next, the n-type amorphous semiconductor layer 151, the intrinsic amorphous semiconductor layer 152, and the p-type amorphous semiconductor layer 153 are formed in this order so as to cover the second insulating film 104 and the lower electrode 14*a* by, for example, plasma CVD (see FIG. 6G).

Figure 6H:
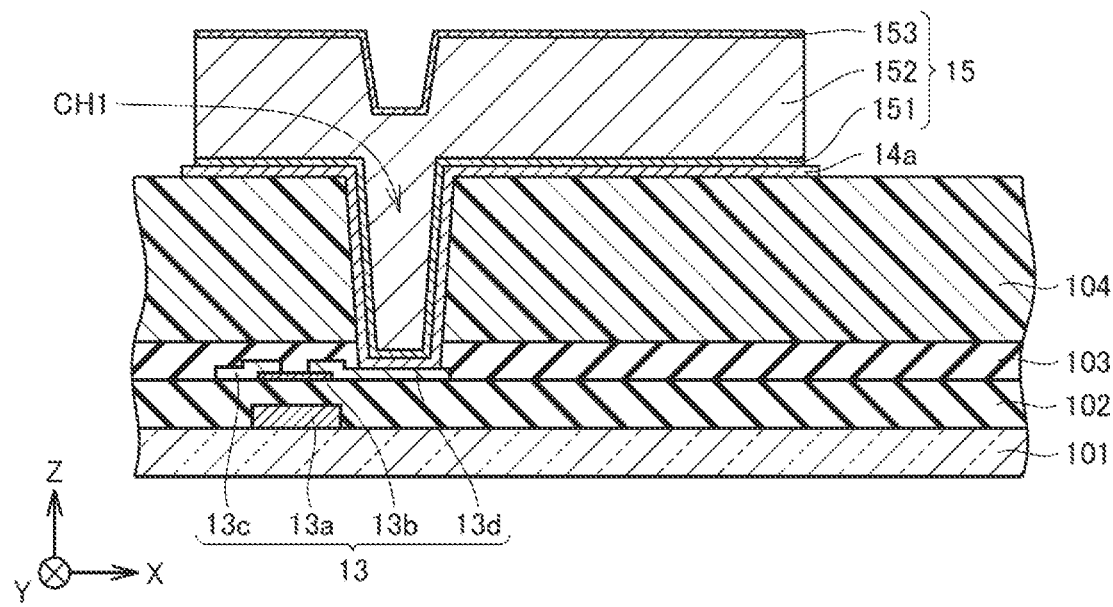
FIG. 6H is a cross-sectional view showing a step of patterning the n-type amorphous semiconductor layer, the intrinsic amorphous semiconductor layer, and the p-type amorphous semiconductor layer shown in FIG. 6G so as to form a photoelectric conversion layer.

Then, photolithography and dry etching are carried out, whereby the n-type amorphous semiconductor layer 151, the intrinsic amorphous semiconductor layer 152, and the p-type amorphous semiconductor layer 153 are patterned. As a result, the photoelectric conversion layer 15 is formed (see FIG. 6H).

Figure 6I:
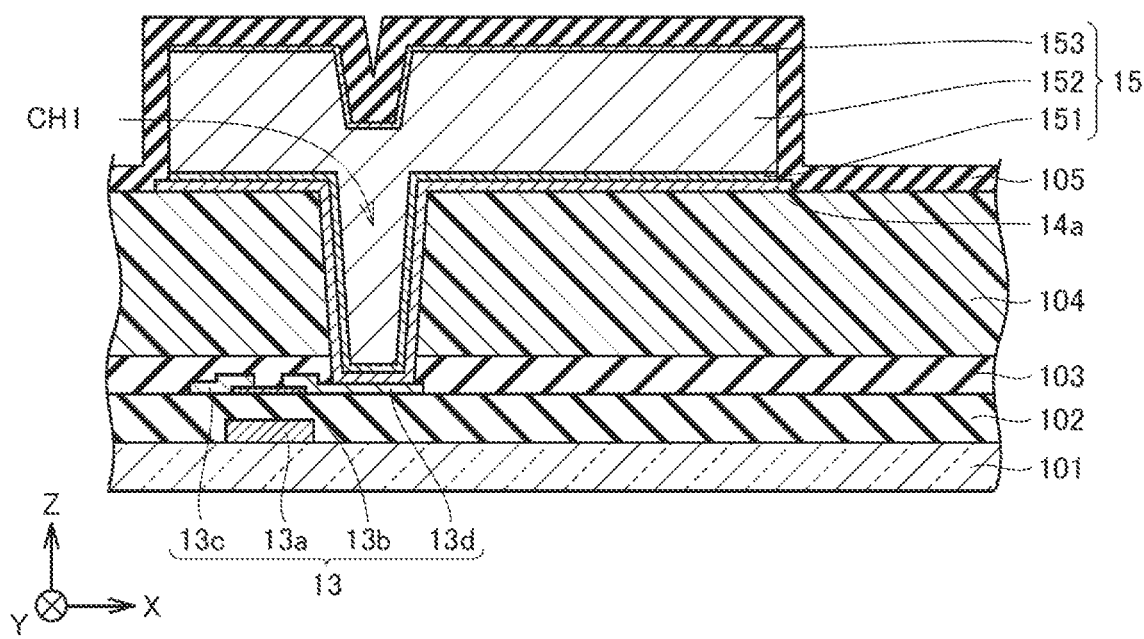
FIG. 6I is a cross-sectional view showing a step of forming a third insulating film so that the third insulating film covers the photoelectric conversion layer shown in FIG. 6H.

Next, the third insulating film 105 made of silicon nitride (SiN) is formed so as to cover the surface of the photoelectric conversion layer 15, by, for example, plasma CVD (see FIG. 6I).

Figure 6J:
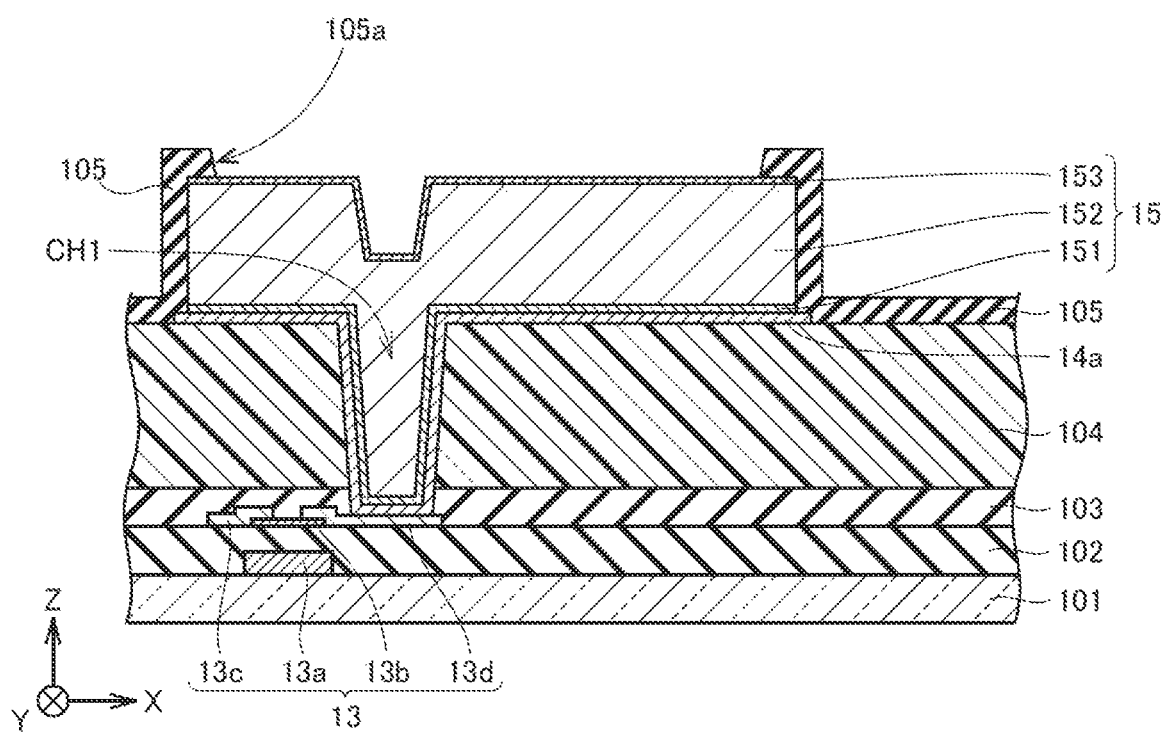
FIG. 6J is a cross-sectional view showing a step of forming an opening in the third insulating film shown in FIG. 6I.

Subsequently, photolithography and wet etching are carried out so that the third insulating film 105 is patterned. Through these steps, the opening 105*a* of the third insulating film 105 is formed on the p-type amorphous semiconductor layer 153 of the photoelectric conversion layer 15 (see FIG. 6J). In this example, hydrofluoric acid is used as an etchant of the wet etching. Organic matters and native oxide adhering to the surface of the p-type amorphous semiconductor layer 153 of the photoelectric conversion layer 15 are therefore exposed to hydrofluoric acid, thereby to be removed. Incidentally, in this example, an etching agent containing hydrofluoric acid is used for wet-etching the third insulating film 105, but dry etching using fluorine-containing gas (for example, CF4) (reactive ion etching) may be carried out instead.

Figure 6K:
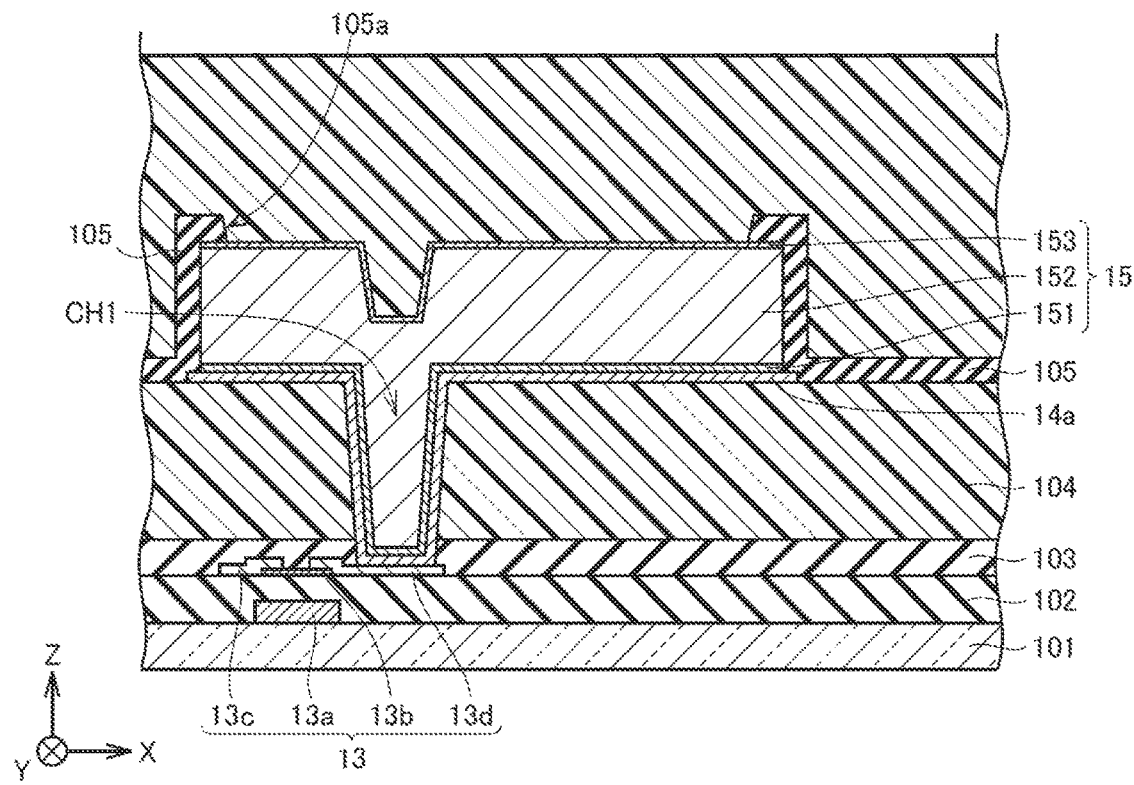
FIG. 6K is a cross-sectional view showing a step of forming a fourth insulating film so that the fourth insulating film covers the third insulating film and the photoelectric conversion layer shown in FIG. 6J.

Thereafter, the fourth insulating film 106 made of acrylic resin or siloxane-based resin is formed so as to cover the third insulating film 105 by, for example, slit coating (see FIG. 6K).

Figure 6L:
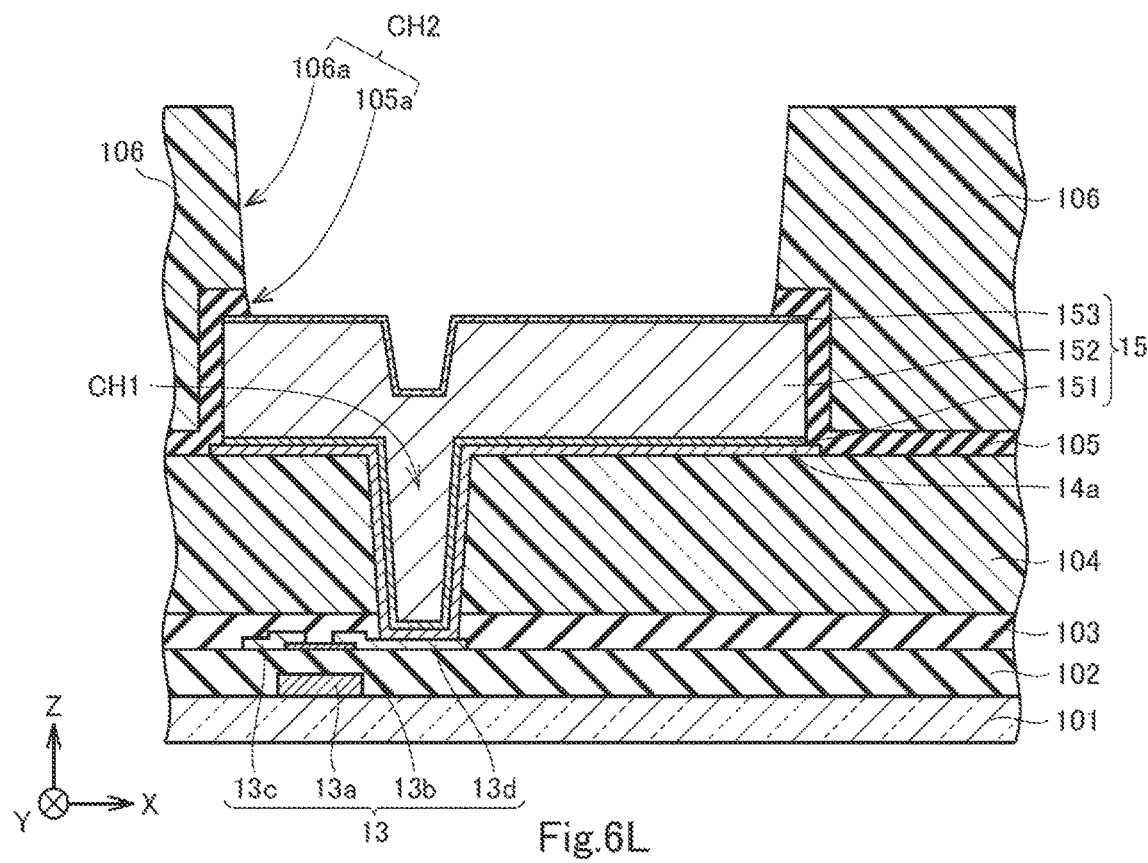
FIG. 6L is a cross-sectional view showing a step of forming an opening in the fourth insulating film shown in FIG. 6K.

Next, using photolithography, the opening 106*a* in the fourth insulating film 106, which overlaps with the opening 105*a* in the third insulating film 105 when viewed in a plan view and has a greater opening width than that of the opening 105*a* is formed. Through these steps, the contact hole CH2 composed of the openings 105*a* and 106*a* is formed (see FIG. 6L).

Figure 6M:
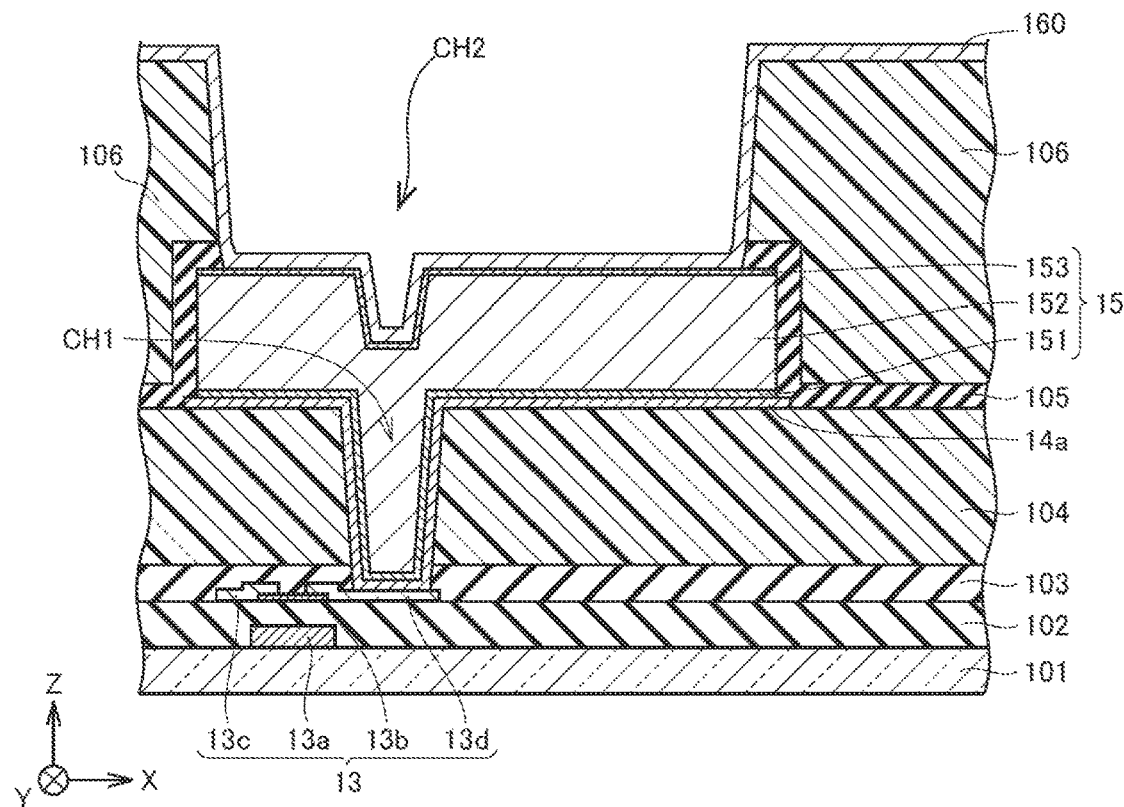
FIG. 6M is a cross-sectional view showing a step of forming a metal film that will become a bias line covering the surfaces of the fourth insulating film and the photoelectric conversion layer in FIG. 6L.

Subsequently, a metal film 160 is formed by laminating molybdenum nitride (MoN), aluminum (Al), and titanium (Ti) in this order, by, for example, sputtering so as to cover the fourth insulating film 106 and the contact hole CH2 (see FIG. 6M).

Figure 6N:
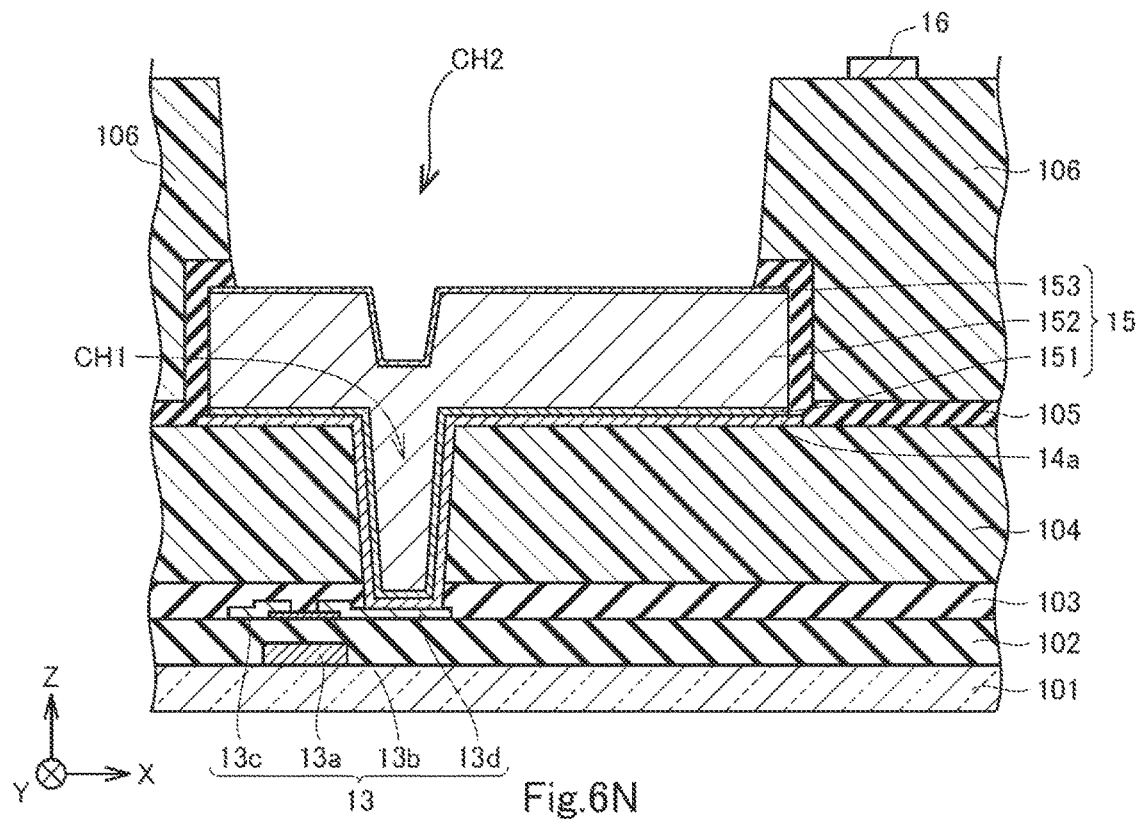
FIG. 6N is a cross-sectional view showing a step of patterning the metal film in FIG. 6M that will become a bias line, so as to form the bias line.

Then, photolithography and wet etching are carried out so that the metal film 160 is patterned. Through these steps, the bias line 16 is formed at a position that does not overlap with the photoelectric conversion layer 15 when viewed in a plan view (see FIG. 6N).

Figure 6O:
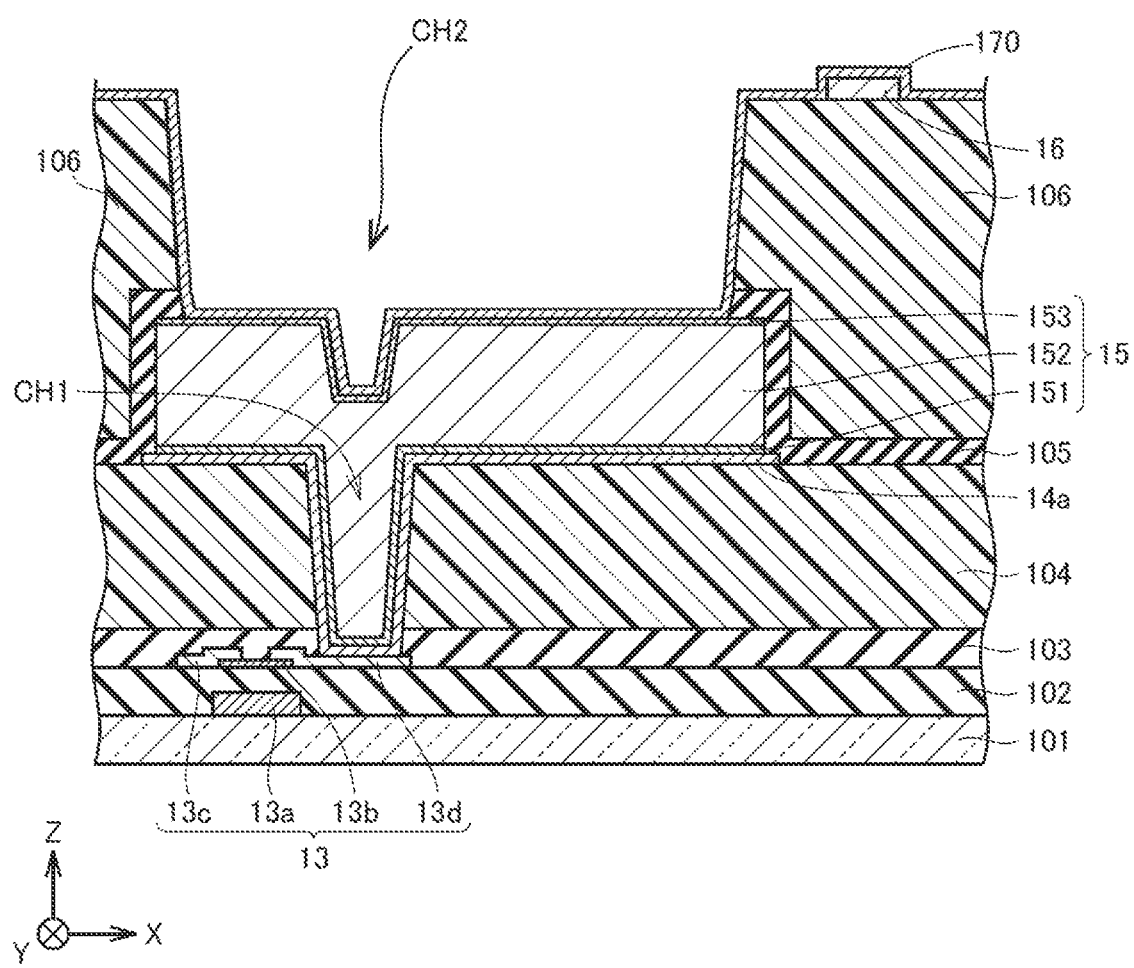
FIG. 6O is a cross-sectional view showing a step of forming a semiconductor film that will become a protection film that covers the surfaces of the bias line and the photoelectric conversion layer in FIG. 6N.
Figure 6P:
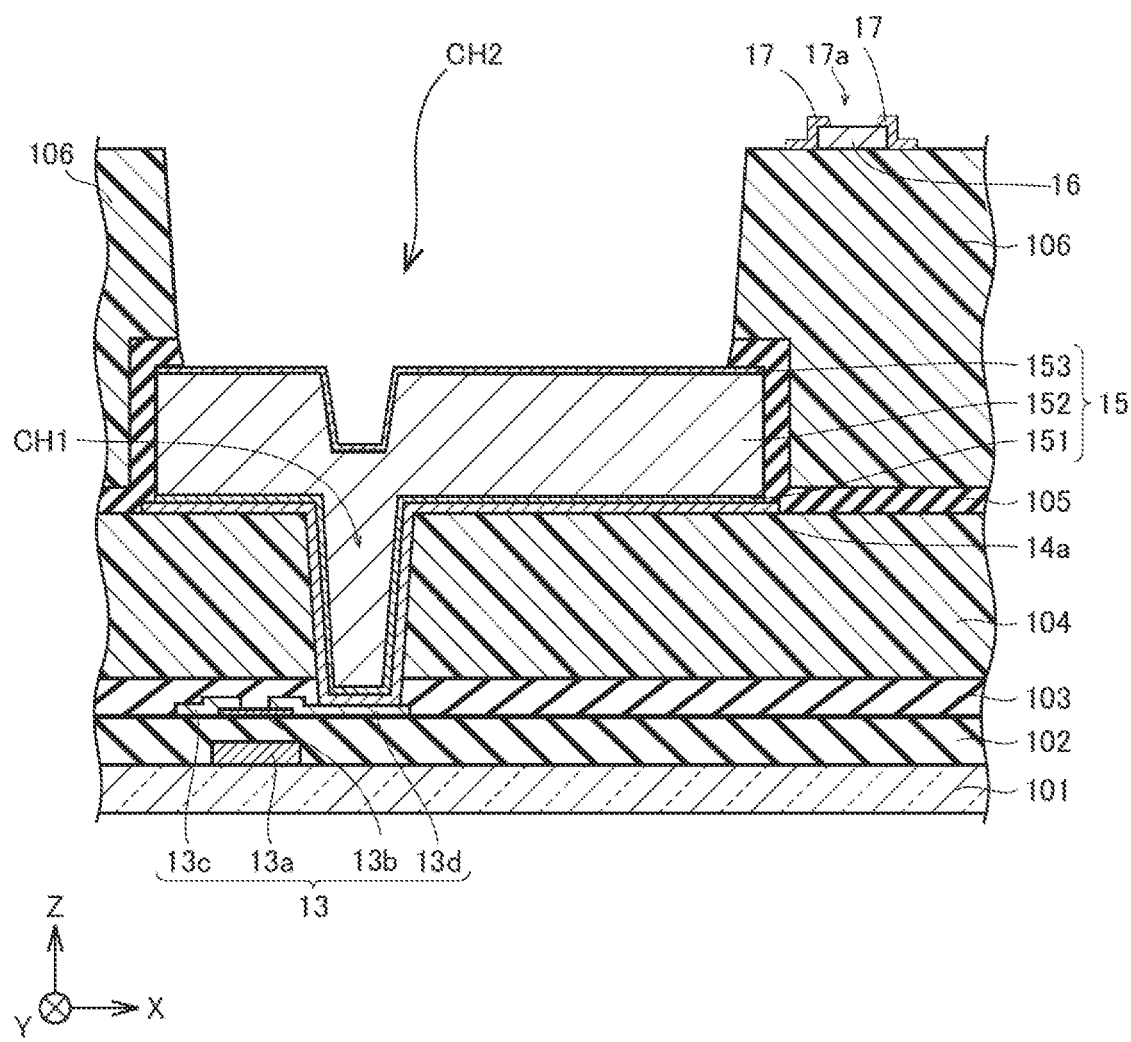
FIG. 6P is a cross-sectional view showing a step of patterning the semiconductor film in FIG. 6O so as to form the protection film.

Next, the semiconductor layer 170 made of amorphous silicon is formed by, for example, plasma CVD so as to cover the fourth insulating film 106, the contact hole CH2, and the bias line 16 (see FIG. 6O).

Then, photolithography and dry etching are carried out so that the semiconductor layer 170 is patterned. In this dry etching step, fluorine-containing gas (for example, CF4) may be used as etching gas. This causes the protection film 17 to be formed in such a manner that the protection film 17 is separated on the top surface of the bias line 16 and covers a part of the top surface and the side surfaces of the bias line 16, and the opening 17*a* in the protection film 17 is formed in the separated part on the bias line 16 (see FIG. 6P).

Figure 6Q:
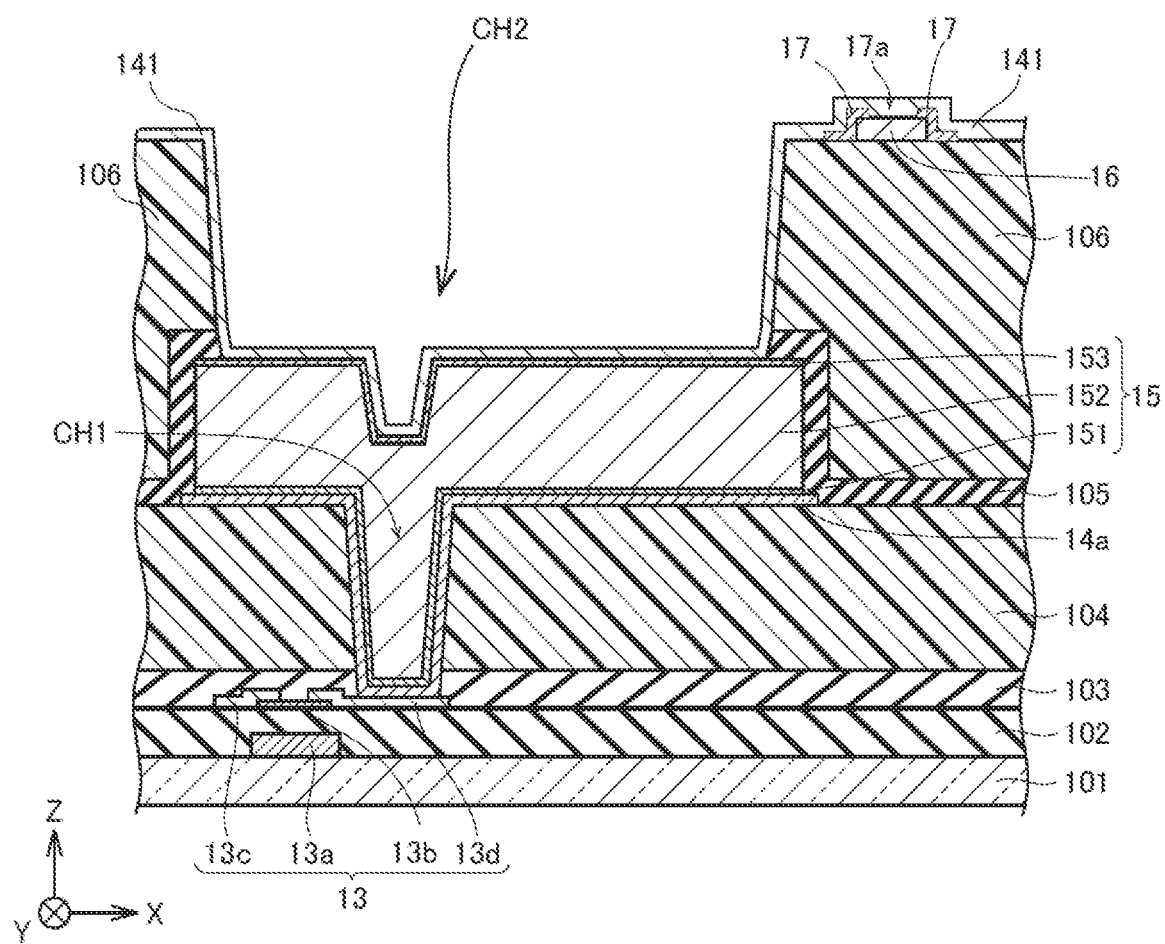
FIG. 6Q is a cross-sectional view showing a step of forming a transparent conductive film that will become an upper electrode covering the surfaces of the protection film and the photoelectric conversion layer in FIG. 6P.

Thereafter, a transparent conductive film 141 made of ITO is formed by, for example, sputtering so as to cover the fourth insulating film 106, the contact hole CH2, the protective film 17, and the bias line 16 (see FIG. 6Q).

Figure 6R:
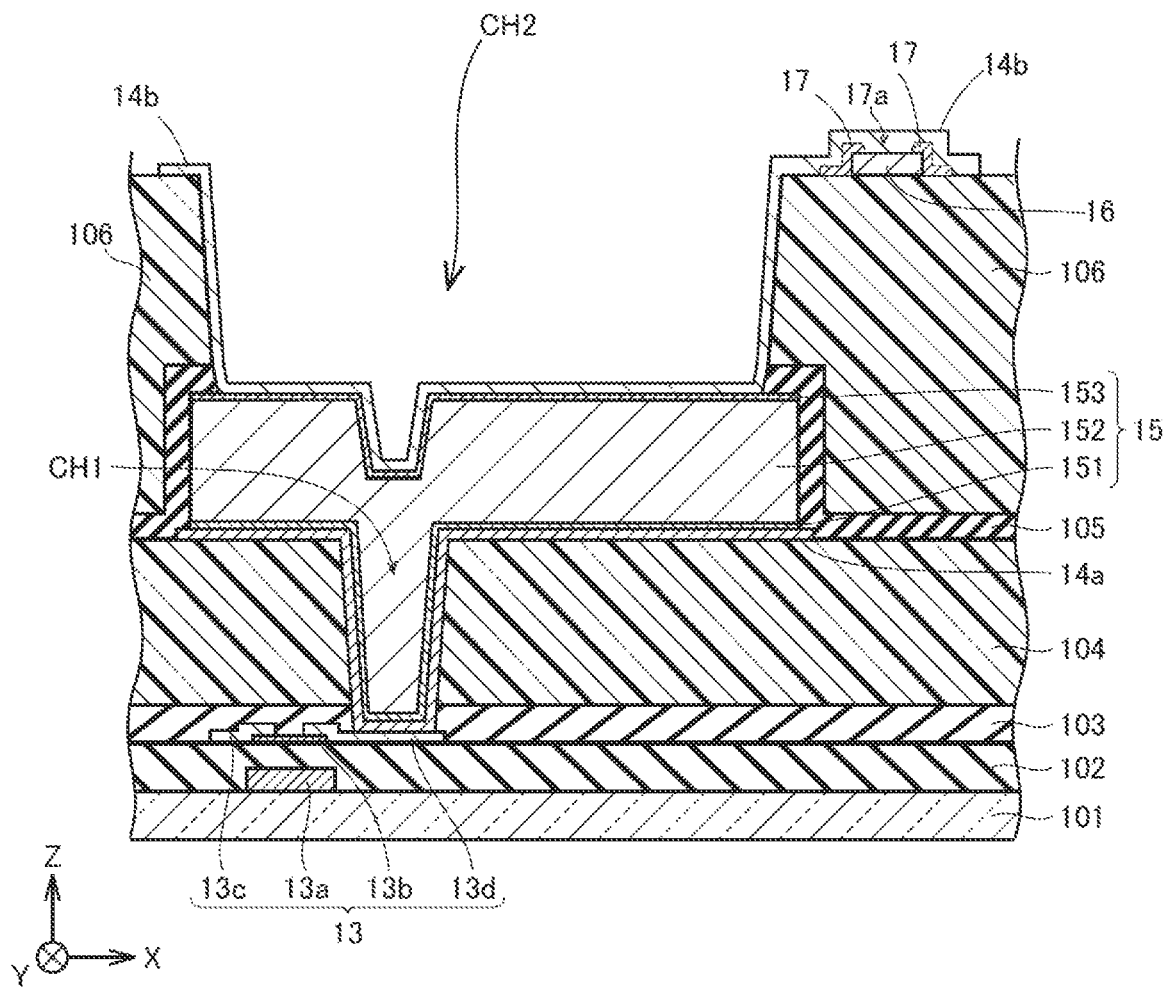
FIG. 6R is a cross-sectional view showing a step of patterning the transparent conductive film in FIG. 6Q so as to form the upper electrode.

Then, photolithography and dry etching are carried out so that the transparent conductive film 141 is patterned. Through these steps, the upper electrode 14b, connected with the p-type amorphous semiconductor layer 153 of the photoelectric conversion layer 15 through the contact hole CH2 and connected with the bias line 16 through the opening 17a, is formed (see FIG. 6R).

Figure 6S:
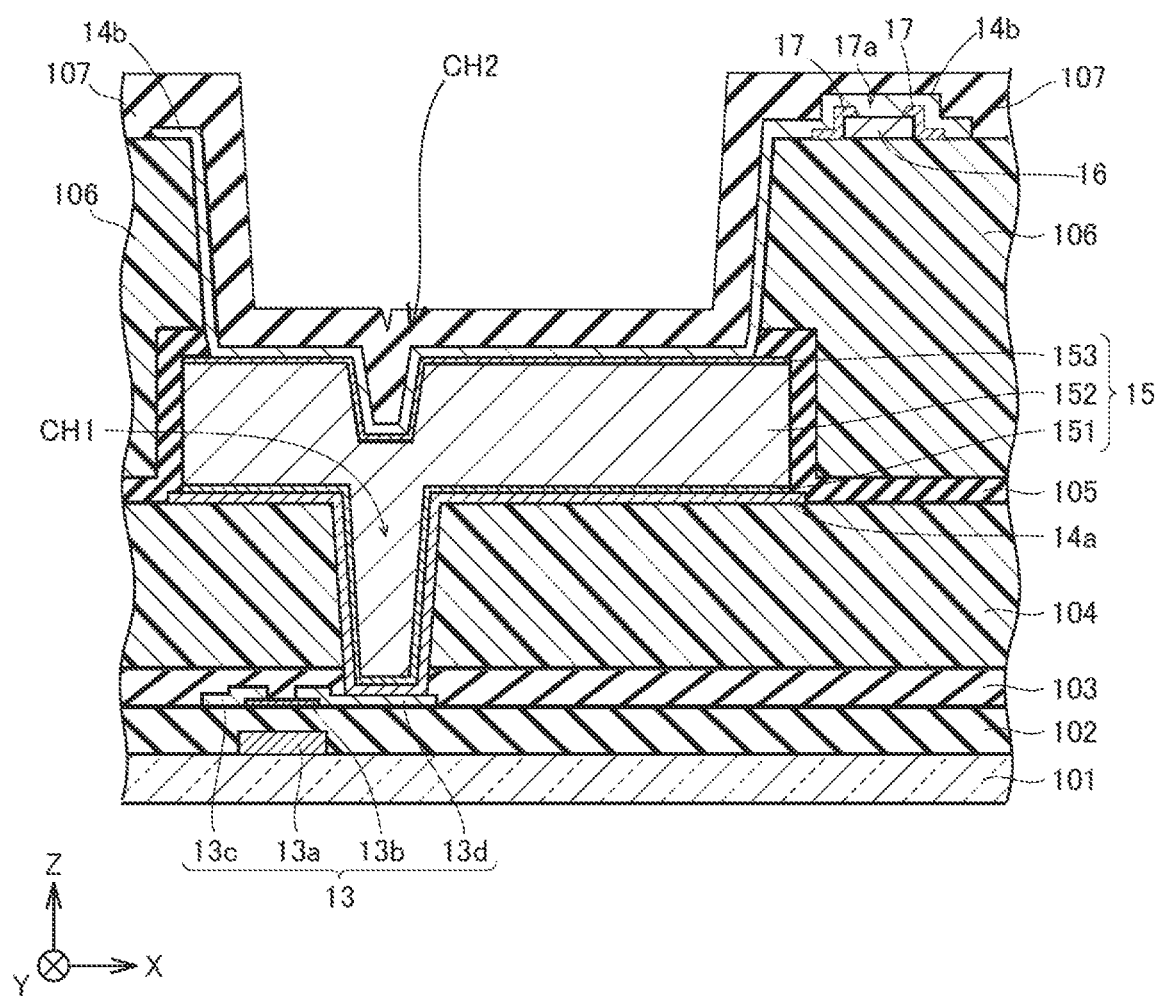
FIG. 6S is a cross-sectional view showing a step of forming a fifth insulating film covering the upper electrode in FIG. 6R.
Figure 6T:
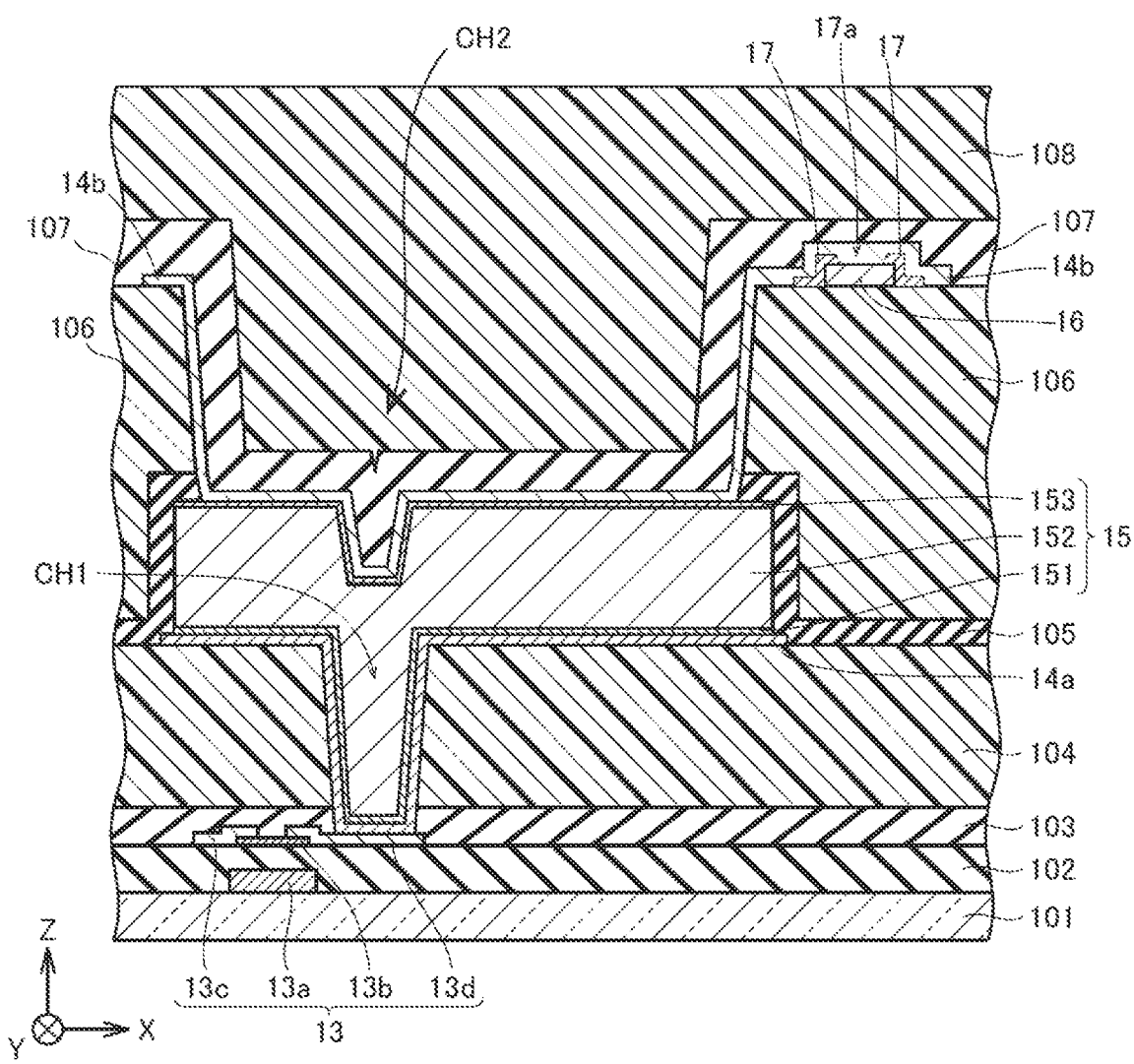
FIG. 6T is a cross-sectional view showing a step of forming a sixth insulating film covering the fifth insulating film in FIG. 6S.

Next, the fifth insulating film 107 made of silicon nitride (SiN) is formed by, for example, plasma CVD so as to cover the fourth insulating film 106 and the upper electrode 14b (see FIG. 6S).

Subsequently, the sixth insulating film 108 made of acrylic resin or siloxane-based resin is formed on the fifth insulating film 107 by, for example, slit coating (see FIG. 6T). Through these steps, the pixel portion in the imaging panel 1 of the present example is formed.

The method described above is the method for producing the imaging panel 1 in Embodiment 1. As described above, in the present embodiment, hydrofluoric acid is used in the etching of the third insulating film 105 covering the photoelectric conversion layer 15, and this makes it possible to remove deposits such as organic matters, native oxide, and the like adhering to the surface of the photoelectric conversion layer 15, simultaneously when the third insulating film 105 is formed. As a result, it is likely to obtain better contact between the upper electrode 14b and the p-type amorphous semiconductor layer 153, which makes it unlikely that off-leakage current due to contaminants and the like would be generated in the photoelectric conversion layer 15.

Besides, in Embodiment 1, the bias line 16 has, for example, a laminate structure obtained by laminating a metal film made of molybdenum nitride (MoN), a metal film made of aluminum (Al), and a metal film made of molybdenum nitride (MoN). Aluminum (Al) has low resistance against hydrofluoric acid, as compared with molybdenum nitride (MoN). For this reason, for example, when native oxide and the like adhering to the surface of the p-type amorphous semiconductor layer 153 are to be removed using hydrofluoric acid immediately before the upper electrode 14b is formed as well, the bias line 16 would be etched, in the portion of the metal film made of aluminum (Al), if there is no protection film 17. In other words, the bias line 16 would be side-etched, whereby the width of the bias line 16 would be decreased to be smaller than the desired width. In Embodiment 1, a part of the top surface and the side surfaces of the bias line 16 are covered with the protection film 17. The protection film 17 is formed with an inorganic insulating film made of amorphous silicon, silicon nitride (SiN$_x$), or the like that is hardly etched by hydrofluoric acid. For this reason, even if a treatment for removing native oxide and the like on the p-type amorphous semiconductor layer 153 with use of hydrofluoric acid is carried out also immediately before the upper electrode 14b is formed, the bias line 16 is not etched, resulting in that a desired line width can be maintained.

(Operation of X-Ray Imaging Device 100)

Here, operations of the X-ray imaging device 100 shown in FIG. 1 are described. First, X-rays are emitted from the X-ray source 3. Here, the control unit 2 applies a predetermined voltage (bias voltage) to the bias line 16 (see FIG. 3 and the like). X-rays emitted from the X-ray source 3 transmit an object S, and are incident on the scintillator 1A. The X-rays incident on the scintillator 1A are converted into fluorescence (scintillation light), and the scintillation light is incident on the imaging panel 1. When the scintillation light is incident on the photodiode 12 provided in each pixel in the imaging panel 1, the scintillation light is changed to charges by the photodiode 12 in accordance with the amount of the light. A signal according to the charges converted by the photodiode 12 is read out through the source line 10 to the signal reading unit 2B (see FIG. 2 and the like) when the TFT 13 (see FIG. 3 and the like) is in the ON state according to a gate voltage (positive voltage) that is output from the gate control unit 2A through the gate line 11. Then, an X-ray image in accordance with the signal thus read out is generated in the control unit 2.

Embodiment 2

Embodiment 2 is described with reference to an example in which the imaging panel 1 in Embodiment 1 described above is produced by a method different from the method in Embodiment 1. The following description principally describes the steps different from those in Embodiment 1.

In the present embodiment, first, the steps shown in FIGS. 6A to 6I in Embodiment 1 described above are carried out so that the third insulating film 105 is formed on the photoelectric conversion layer 15. Thereafter, the fourth insulating film 106 made of acrylic resin or siloxane-based resin is formed by, for example, slit-coating so as to cover the third insulating film 105 (see FIG. 7A).

Figure 7A:
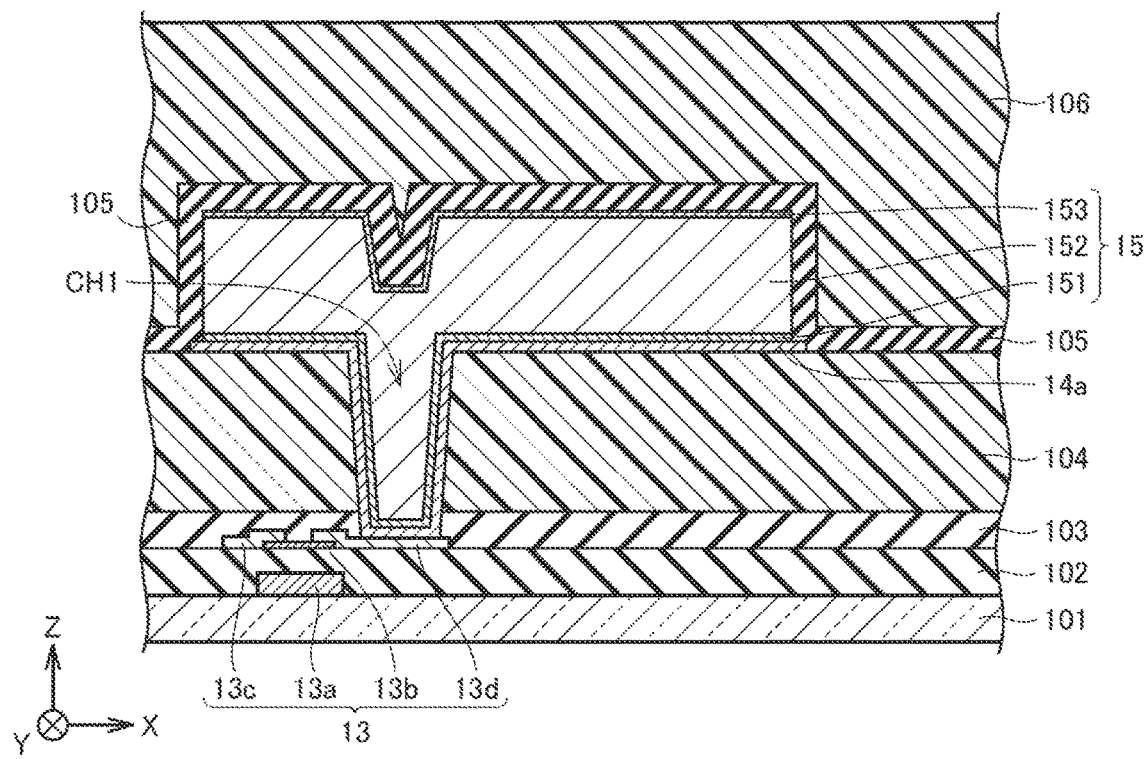
FIG. 7A is a cross-sectional view showing a step in a process for producing an imaging panel in Embodiment 2, the step being a step of forming a fourth insulating film after the step shown in FIG. 6I.
Figure 7B:
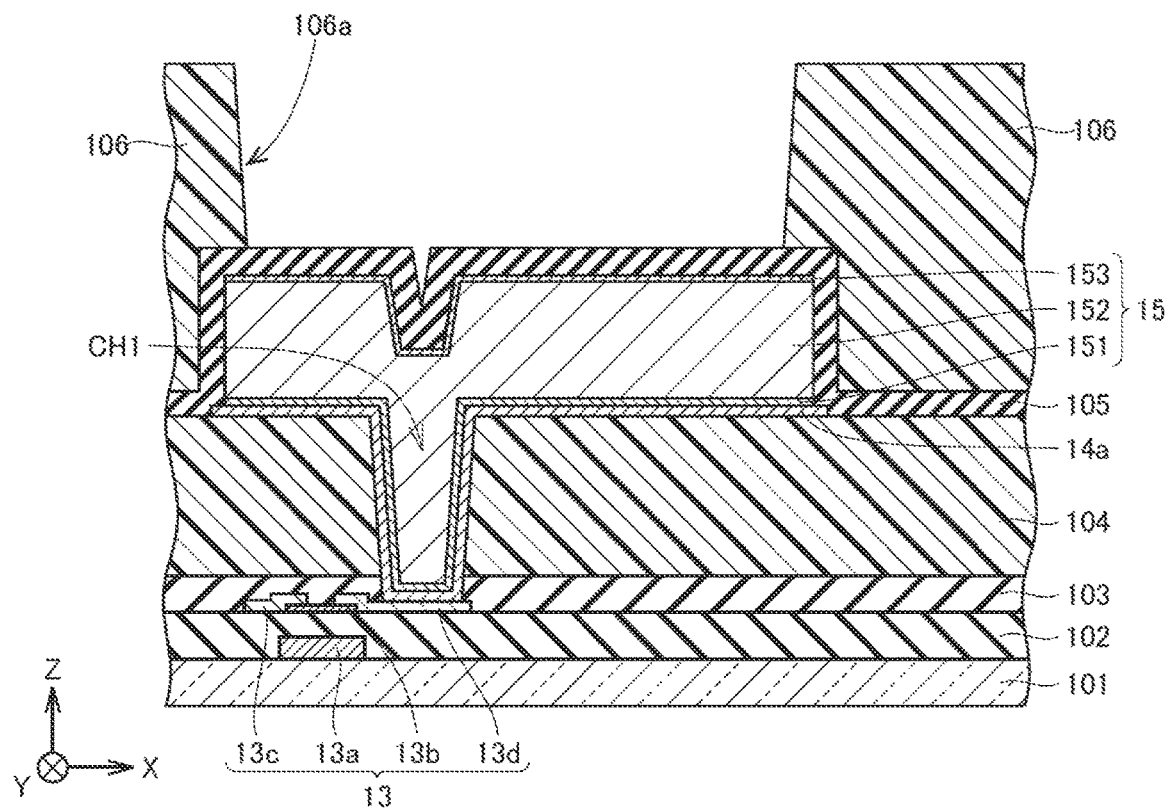
FIG. 7B is a cross-sectional view showing a step of forming an opening in the fourth insulating film in FIG. 7A.

Then, by using photolithography, the opening 106a in the fourth insulating film 106 is formed at a position that overlaps with the photoelectric conversion layer 15 (see FIG. 7B).

Figure 7C:
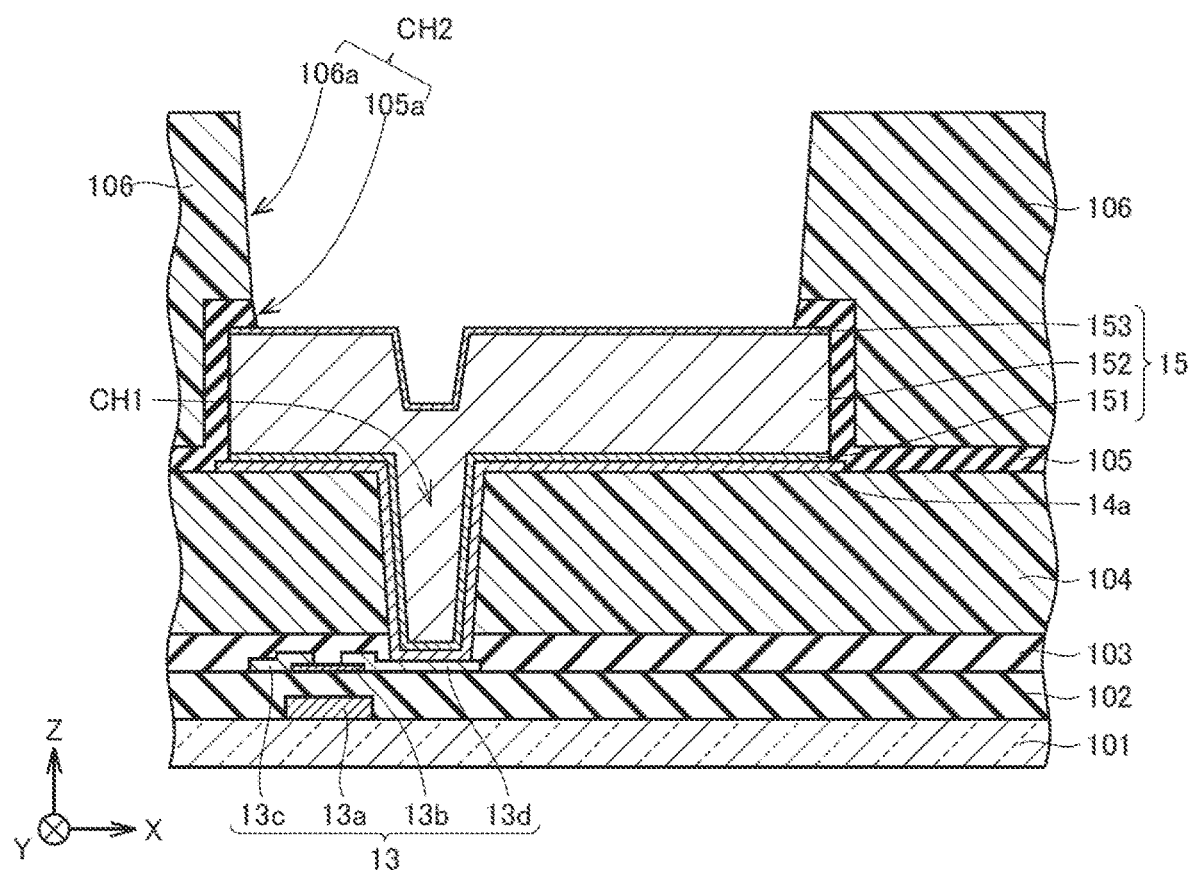
FIG. 7C is a cross-sectional view showing a step of forming an opening in the third insulating film in FIG. 7B.

Next, photolithography and wet etching are carried out so that the third insulating film 105 is patterned. Through these steps, the opening 105a in the third insulating film 105 is formed inside the opening 106a in the fourth insulating film 106 (see FIG. 7C). Here, hydrofluoric acid is used as an etchant of the wet etching. Thereby, the third insulating film 105 can be etched, and at the same time, native oxide and others adhering to the surface of the p-type amorphous semiconductor layer 153 can be removed.

Thereafter, the same steps as the steps shown in FIGS. 6M to 6T in Embodiment 1 described above are carried out, whereby the imaging panel 1 is produced.

In Embodiment 2 as well, a part of the top surface and the side surface of the bias line 16 are covered with the protection film 17. Even if a treatment for removing native oxide and the like on the surface of the p-type amorphous semiconductor layer 153 is carried out with use of hydrofluoric acid, for example, immediately before the upper electrode 14b is formed, it is therefore unlikely that the bias line 16 would be side-etched, which makes it possible to prevent the bias line 16 from having a high resistance.

Embodiment 3

Embodiment 3 is described with reference to an example in which the imaging panel 1 in Embodiment 1 described above is produced by a method different from the methods in Embodiments 1 and 2. The following description principally describes the steps different from those in Embodiment 2.

Figure 8A:
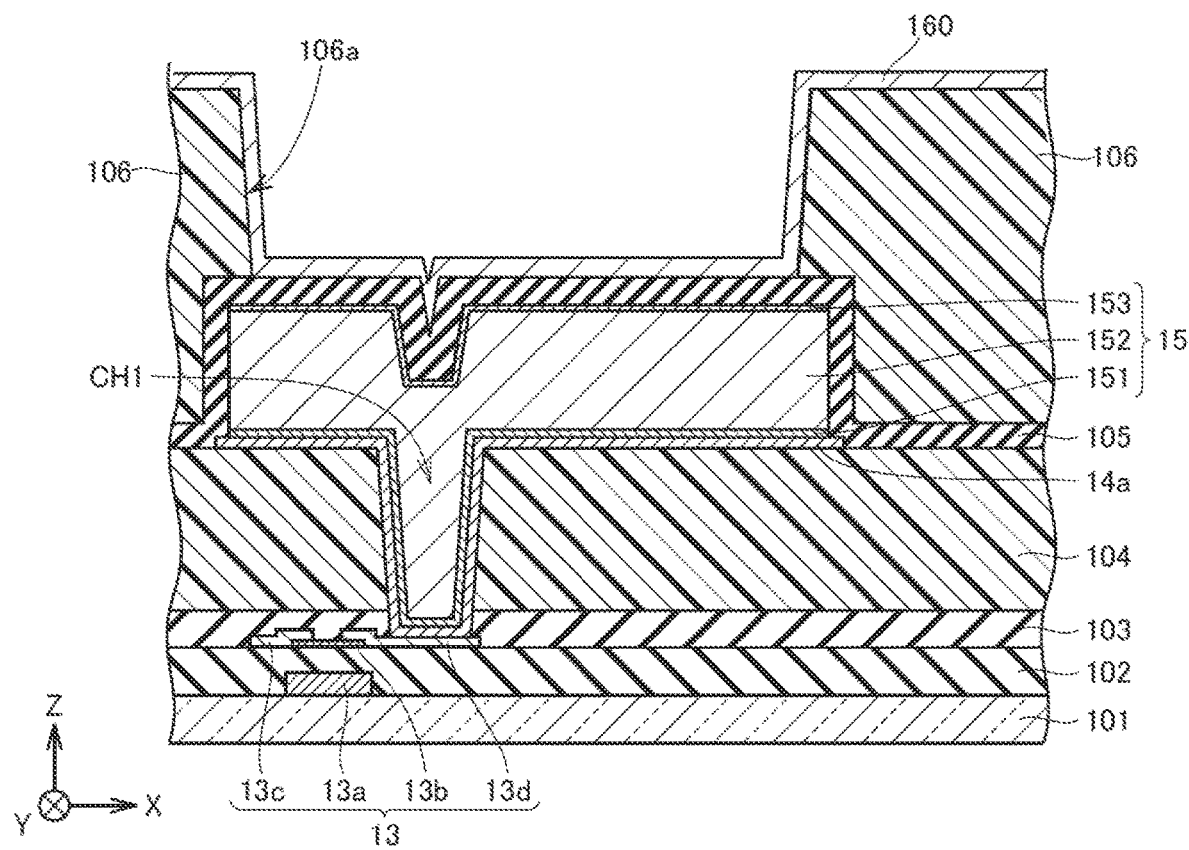
FIG. 8A is a cross-sectional view showing a step in a process for producing an imaging panel in Embodiment 3, the step being a step of forming a metal film that will become a bias line, after the step shown in FIG. 7B.

In the present embodiment, the steps shown in FIGS. 7A and 7B in Embodiment 2 described above are carried out so that the opening 106a in the fourth insulating film 106 is formed at a position that overlaps with the photoelectric conversion layer 15, and thereafter, the metal film 160 is formed by laminating molybdenum nitride (MoN), aluminum (Al), and titanium (Ti) in this order, by, for example, sputtering (see FIG. 8A).

Figure 8B:
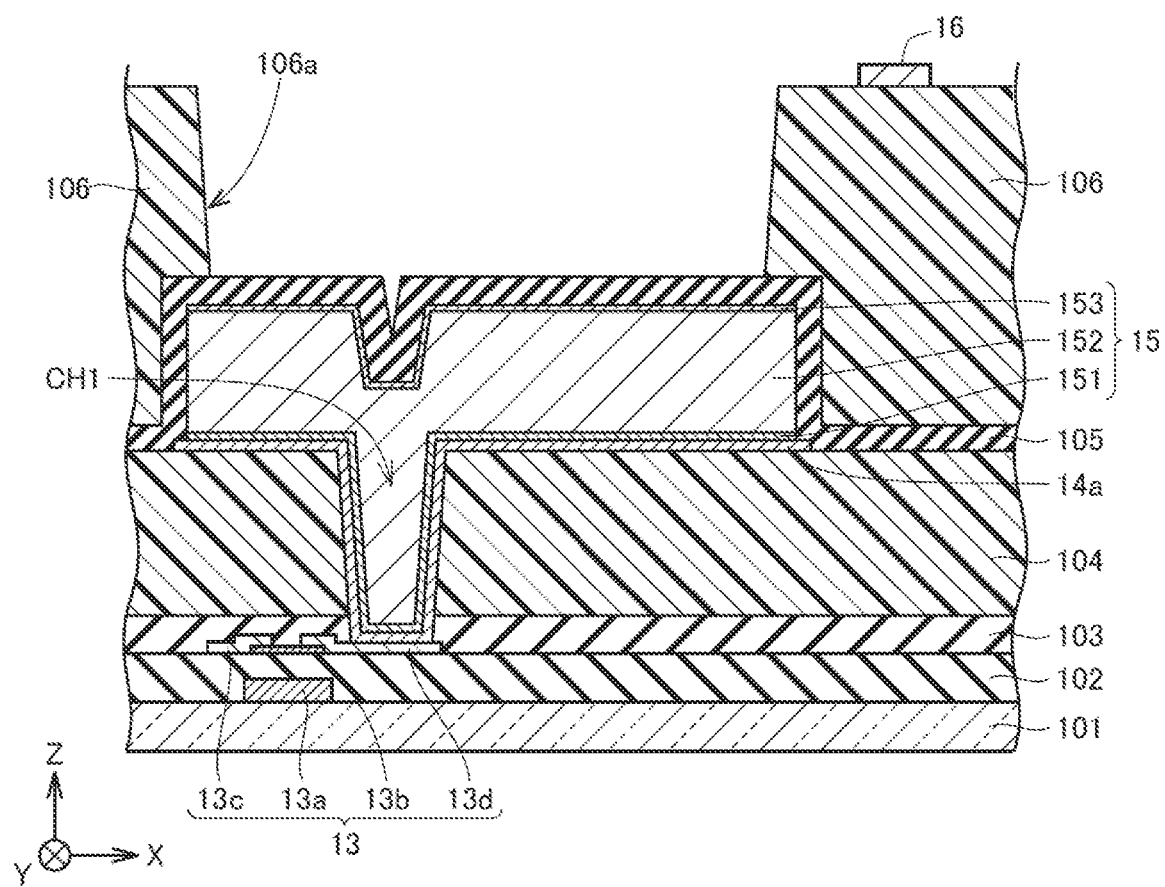
FIG. 8B is a cross-sectional view showing a step of patterning the metal film that will become a bias line in FIG. 8A, so as to form the bias line.
Figure 8C:
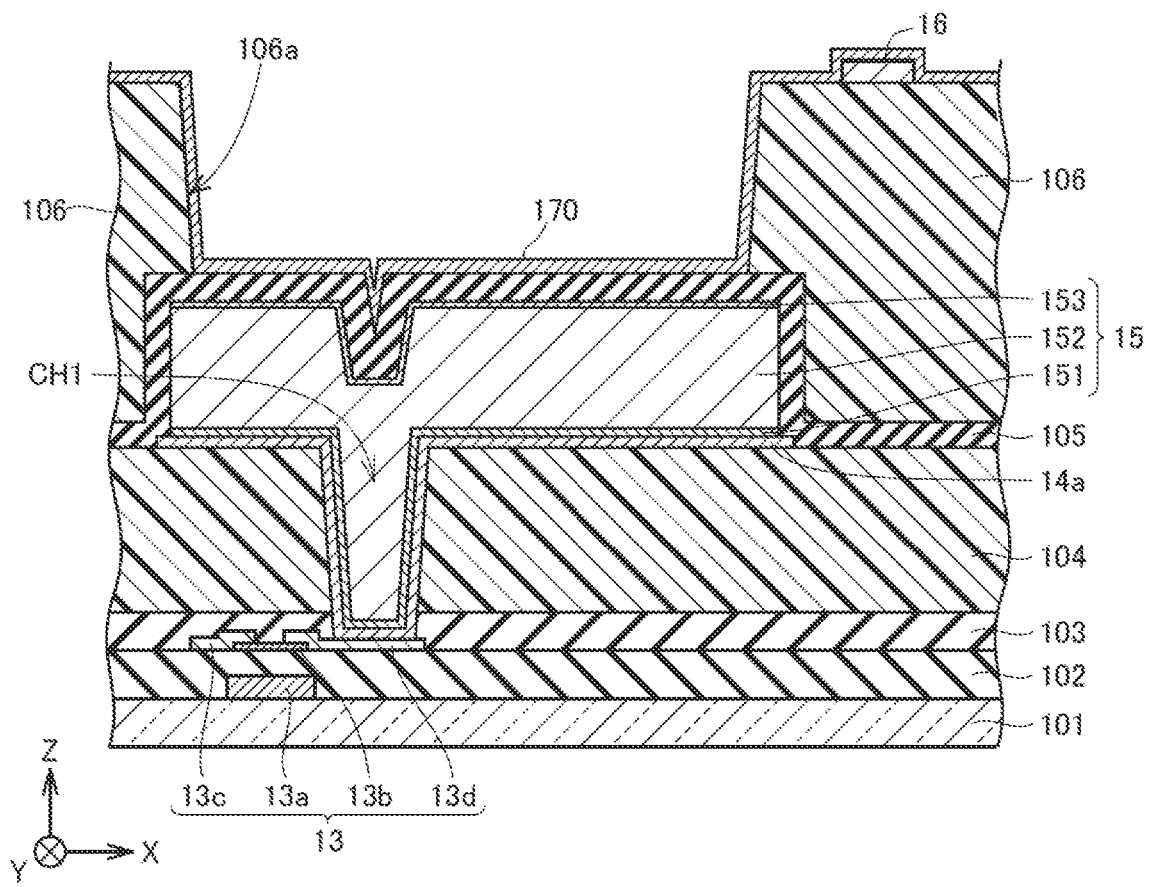
FIG. 8C is a cross-sectional view showing a step of forming a semiconductor film that will become a protection film covering the surfaces of the bias line and the third insulating film in FIG. 8B.

Then, photolithography and wet etching are carried out so that the metal film 160 is patterned. Through these steps, the bias line 16 is formed on the fourth insulating film 106, at a position that does not overlap with the photoelectric conversion layer 15 when viewed in a plan view (see FIG. 8B).

Subsequently, the semiconductor layer 170 made of amorphous silicon is formed by, for example, plasma CVD so as to cover the bias line 16, the third insulating film 105, and the fourth insulating film 106 (see FIG. 8O).

Figure 8D:
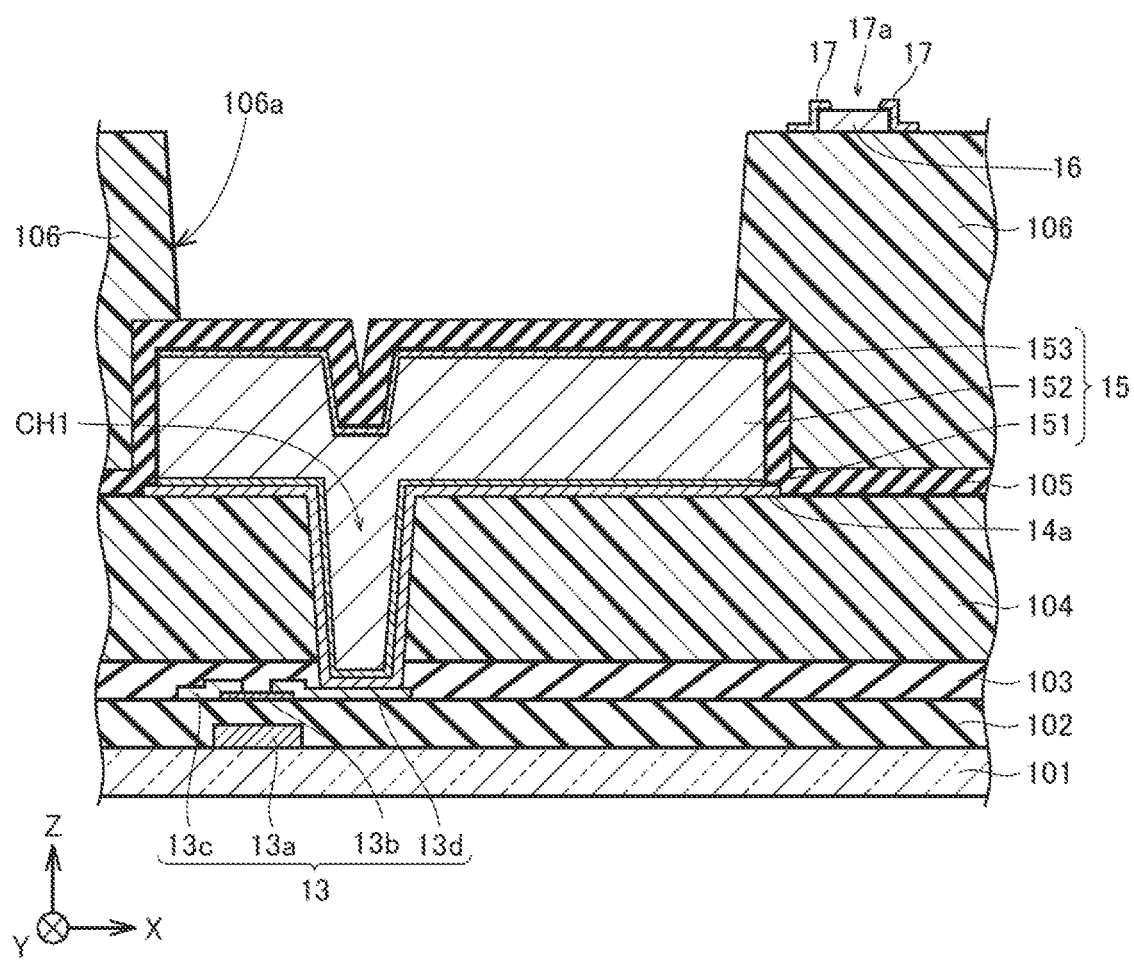
FIG. 8D is a cross-sectional view showing a step of patterning the semiconductor film in FIG. 8C so as to form the protection film.

Then, photolithography and dry etching are carried out so that the semiconductor layer 170 is patterned. Through these steps, the protective film 17 covering a part of the top surface and the side surfaces of the bias line 16 is formed (see FIG. 8D).

Next, photolithography and wet etching are carried out so that the third insulating film 105 is patterned. Through these steps, the opening 105a in the third insulating film 105 is formed inside the opening 106a of the fourth insulating film 106, whereby the contact hole CH2 composed in the openings 105a and 106a is formed (see FIG. 8E). Here, hydrofluoric acid is used as an etchant of the wet etching. Thereby, the third insulating film 105 can be etched, and at the same time, native oxide and others adhering to the surface of the p-type amorphous semiconductor layer 153 can be removed.

Thereafter, the steps shown in FIGS. 6Q to 6T in Embodiment 1 described above are carried out, whereby the imaging panel 1 is produced.

Figure 8E:
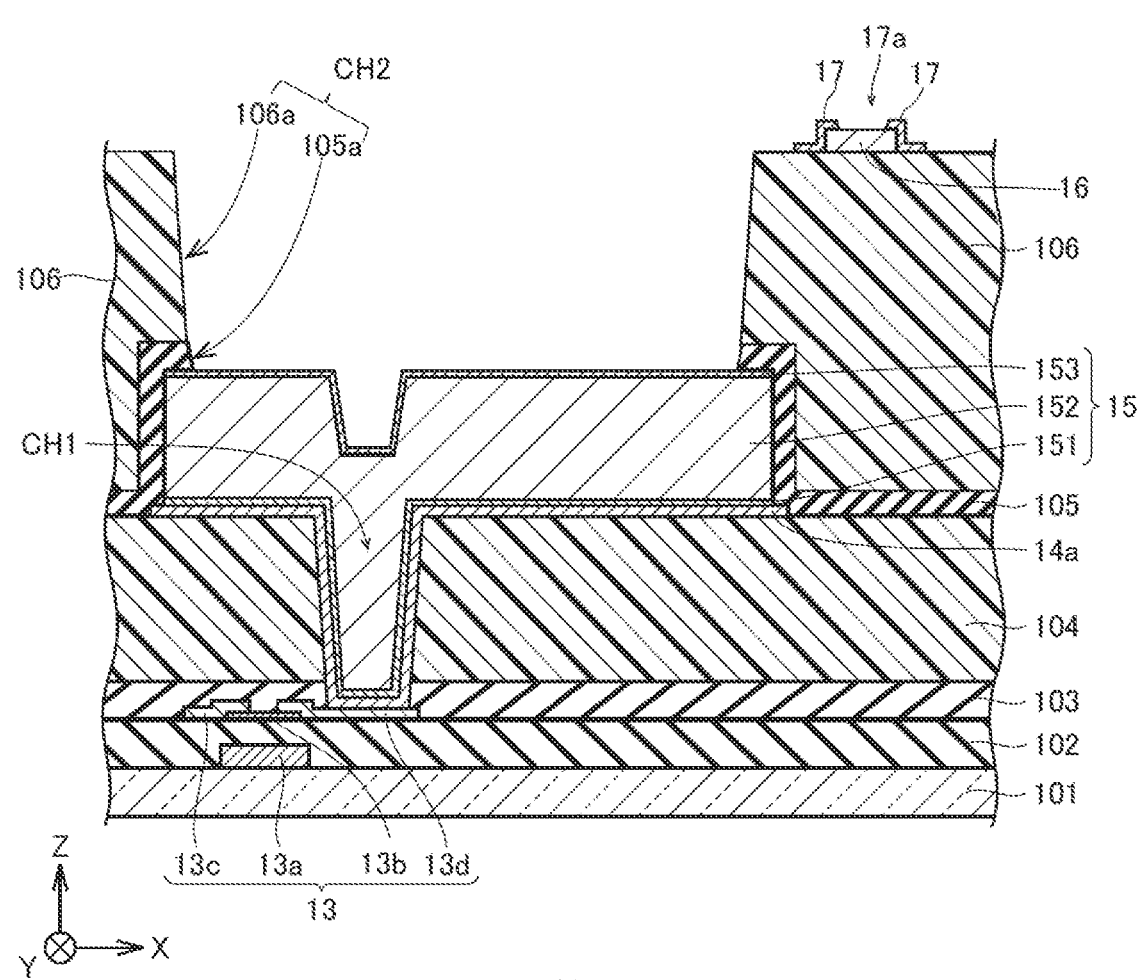
FIG. 8E is a cross-sectional view showing a step of forming an opening in the third insulating film in FIG. 8D.

In Embodiment 3, in the step shown in FIG. 8E, which is the step immediately before the upper electrode 14b is formed, the third insulating film 105 is etched with use of hydrofluoric acid. This makes it possible to form better contact between the p-type amorphous semiconductor layer 153 and the upper electrode 14b, as compared with Embodiments 1 and 2. Further, a part of the top surface and the side surfaces of the bias line 16 are covered with the protection film 17, which makes it unlikely that the bias line 16 would be side-etched by the wet etching of the third insulating film 105. Consequently, it is possible to keep the desired width of the bias line 16.

Embodiment 4

Embodiment 4 is described with reference to an example in which the imaging panel 1 in Embodiment 1 described above is produced by a method different from the methods in Embodiments 1 to 3. The following description principally describes the steps different from those in Embodiment 2.

Figure 9A:
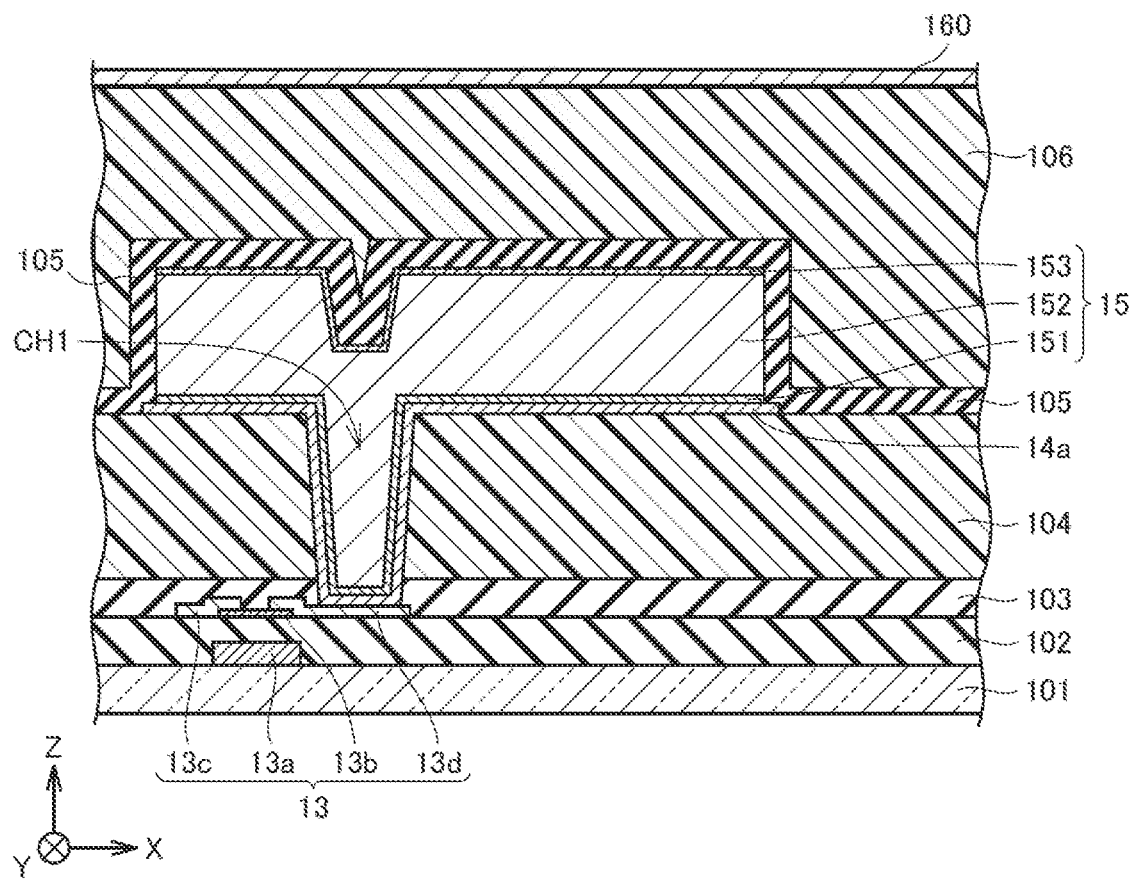
FIG. 9A is a cross-sectional view showing a step in a process for producing an imaging panel in Embodiment 4, the step being a step of forming a metal film that will become a bias line, after the step shown in FIG. 7A.

In the present embodiment, after the step shown in FIG. 7A in Embodiment 2 described above is carried out so that the fourth insulating film 106 is formed on the third insulating film 105, the metal film 160 is formed by laminating molybdenum nitride (MoN), aluminum (Al), and titanium (Ti) in this order, by, for example, sputtering (see FIG. 9A).

Figure 9B:
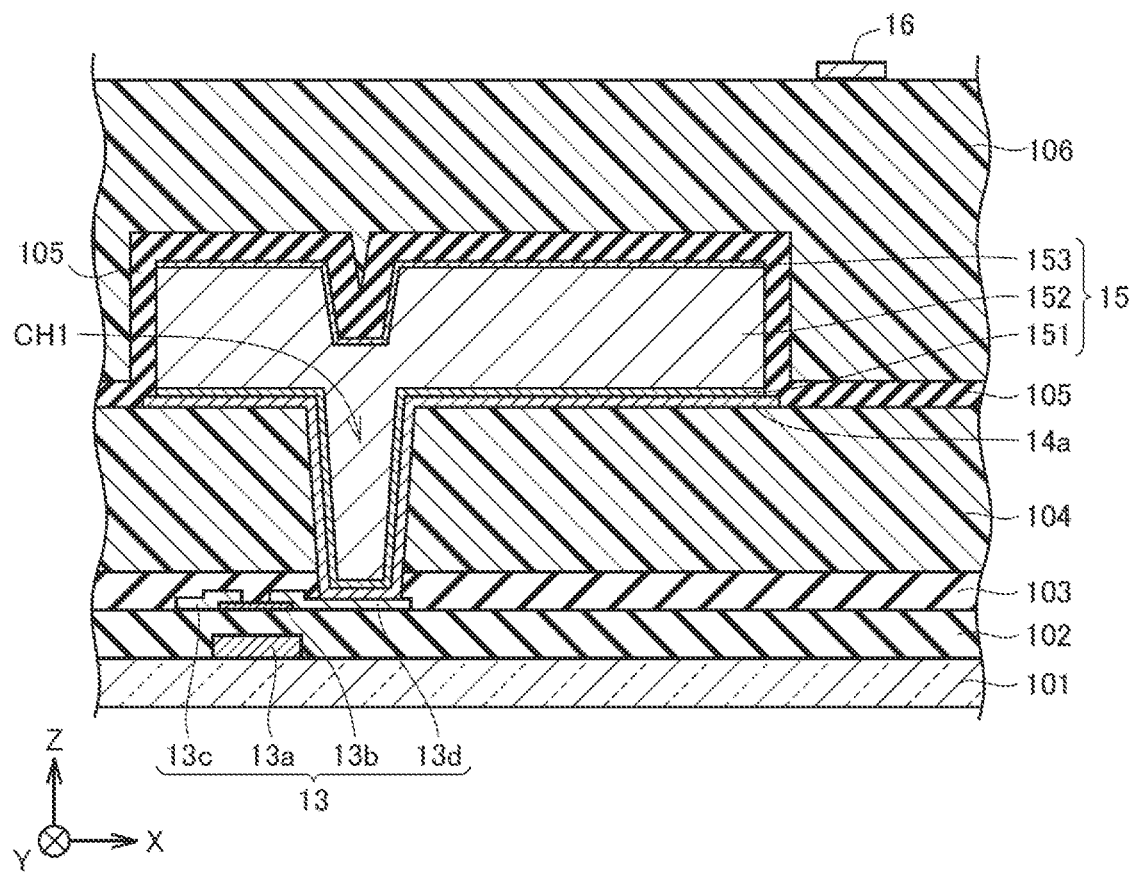
FIG. 9B is a cross-sectional view showing a step of patterning the metal film in FIG. 9A that will become a bias line, so as to form the bias line.

Then, photolithography and wet etching are carried out so that the metal film 160 is patterned. Through these steps, the bias line 16 is formed on the fourth insulating film 106, at a position that does not overlap with the photoelectric conversion layer 15 when viewed in a plan view (see FIG. 9B).

Figure 9C:
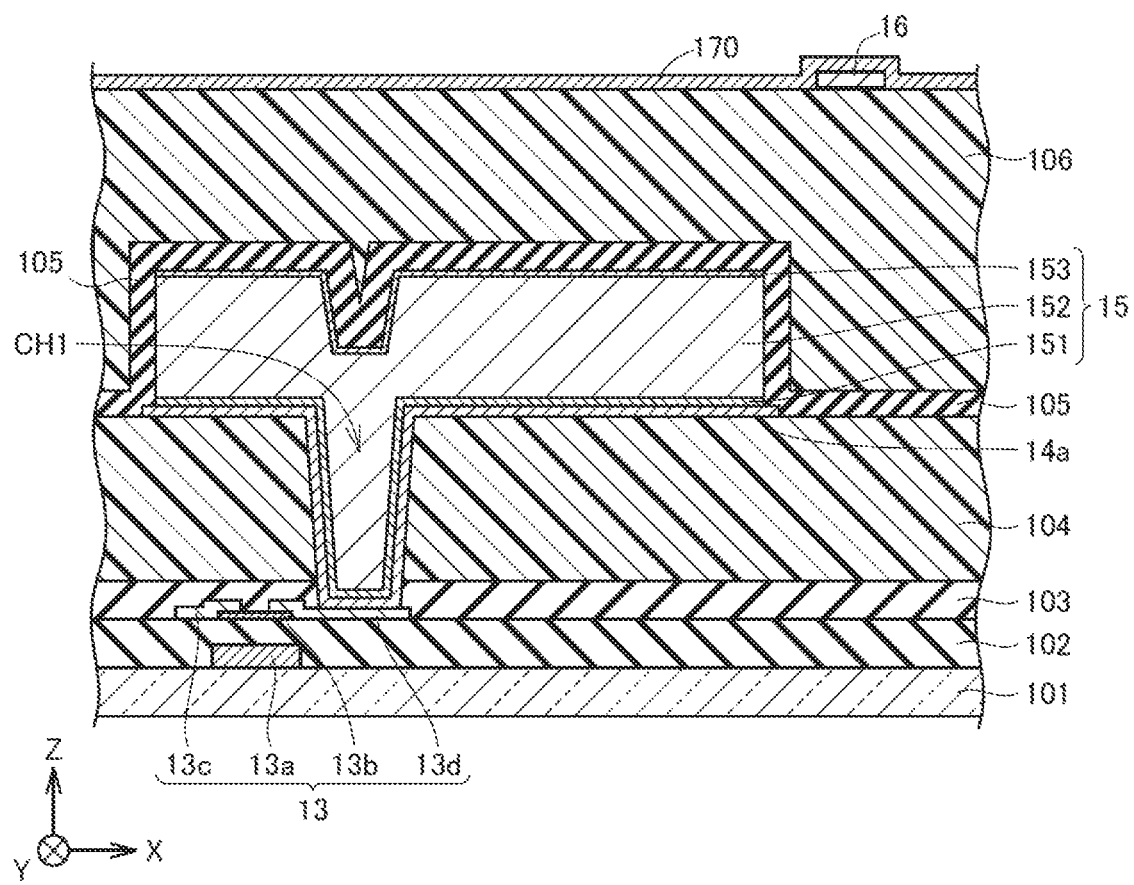
FIG. 9C is a cross-sectional view showing a step of forming a semiconductor film that will become a protection film covering the surfaces of the bias line and the fourth insulating film in FIG. 9B.

Thereafter, the semiconductor layer 170 made of amorphous silicon is formed by, for example, plasma CVD so as to cover the bias line 16 and the fourth insulating film 106 (see FIG. 9C).

Figure 9D:
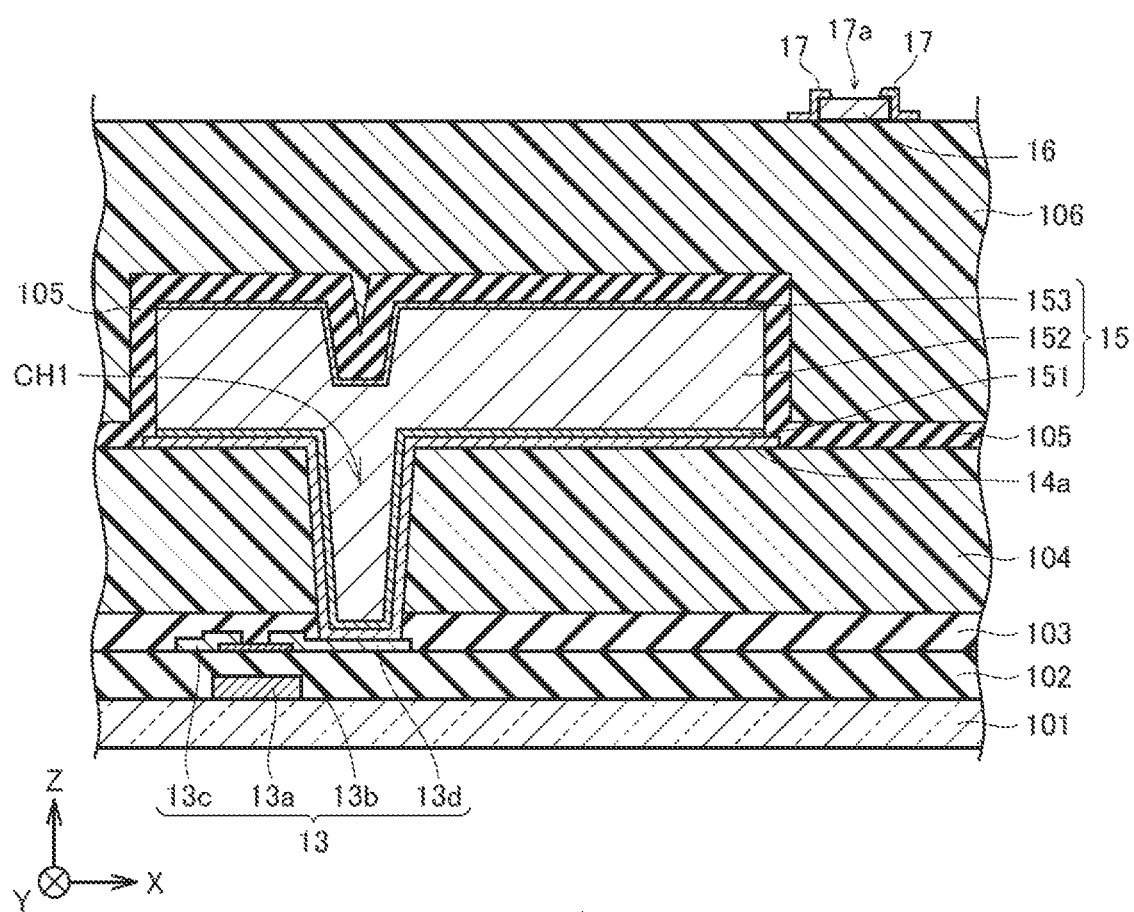
FIG. 9D is a cross-sectional view showing a step of patterning the semiconductor film in FIG. 9C so as to form the protection film.

Then, photolithography and dry etching are carried out so that the semiconductor layer 170 is patterned. Through these steps, the protective film 17 covering a part of the top surface and the side surfaces of the bias line 16 is formed (see FIG. 9D).

Figure 9E:
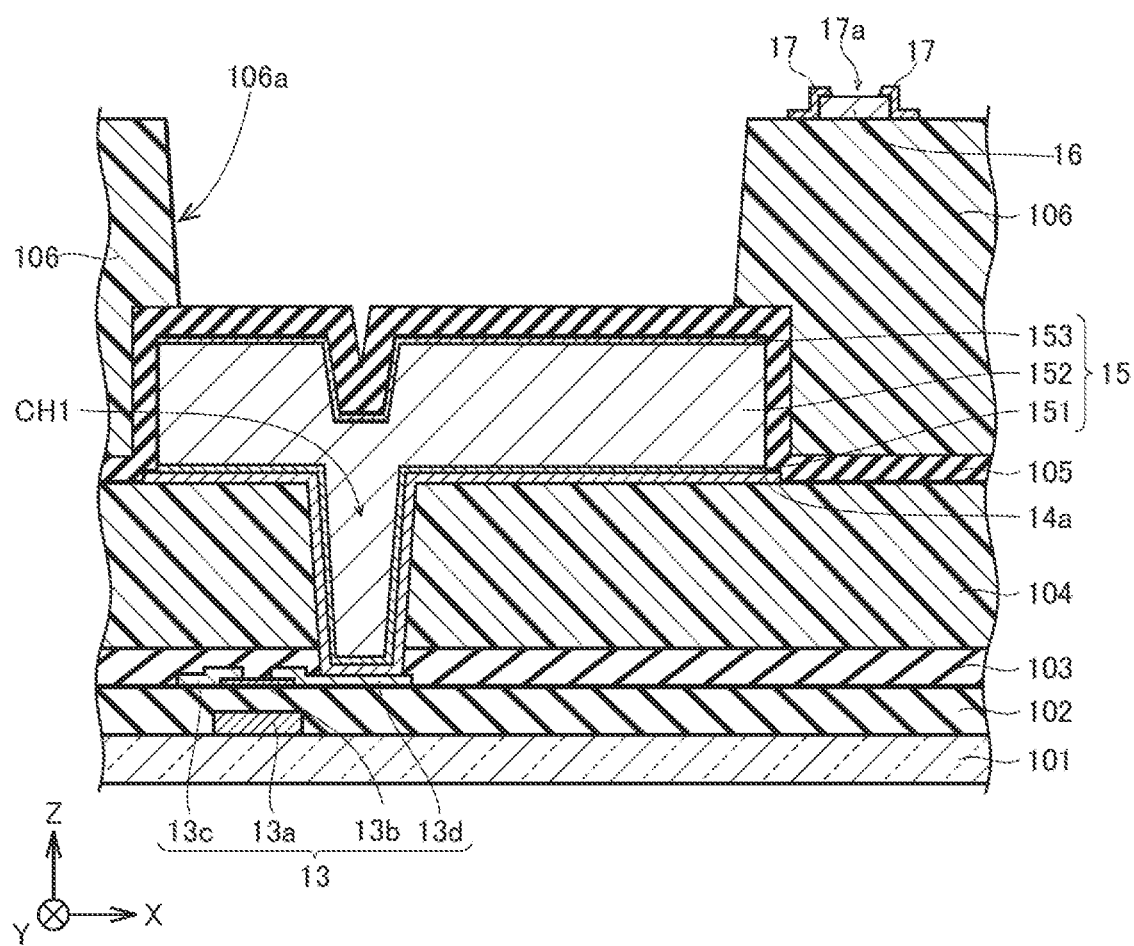
FIG. 9E is a cross-sectional view showing a step of forming an opening in the fourth insulating film in FIG. 9D.

Subsequently, by using photolithography, the opening 106a in the fourth insulating film 106 is formed at a position that overlaps with the photoelectric conversion layer 15 (see FIG. 9E).

Figure 9F:
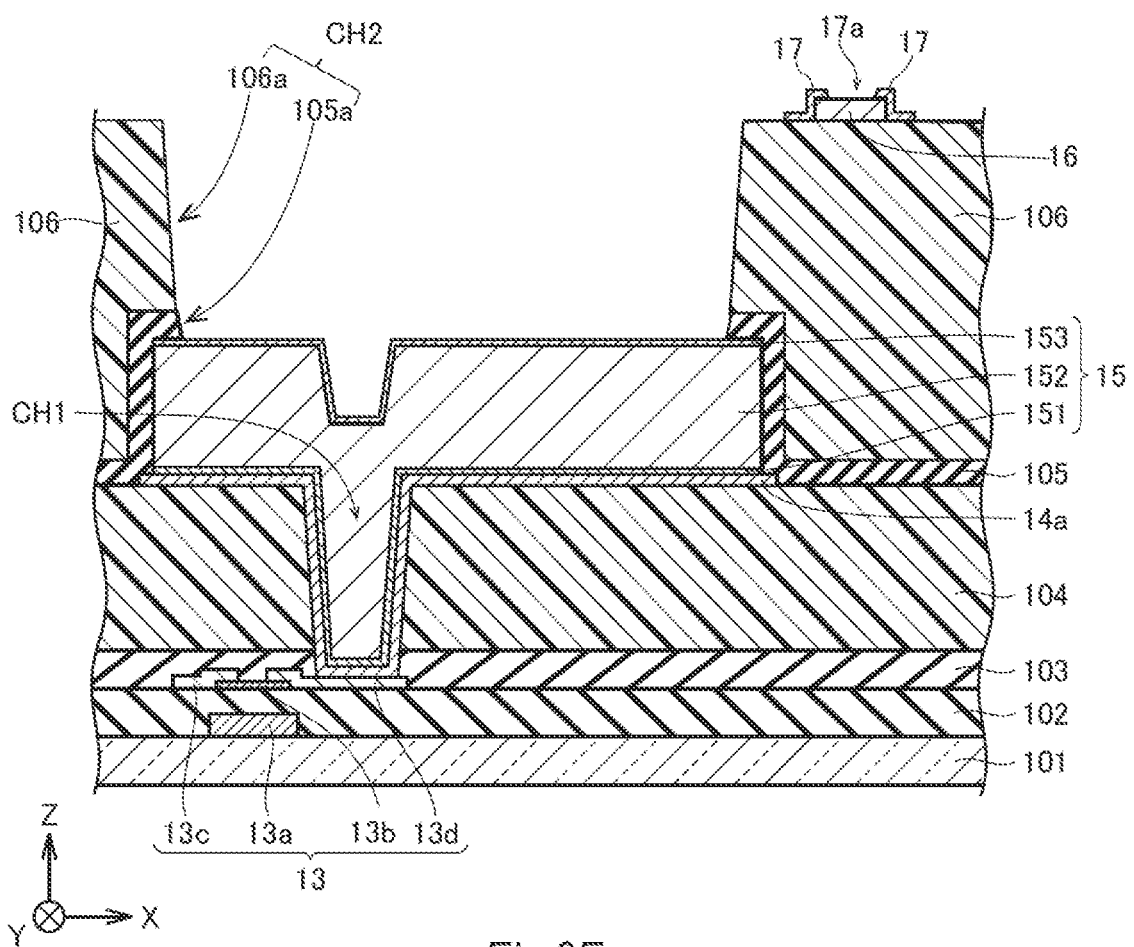
FIG. 9F is a cross-sectional view showing a step of forming an opening in the third insulating film in FIG. 9E.

Then, additionally, photolithography and wet etching are carried out so that the third insulating film 105 is patterned. Through these steps, the opening 105a in the third insulating film 105 is formed inside the opening 106a in the fourth insulating film 106, whereby the contact hole CH2 composed of the openings 105a and 106a is formed (see FIG. 9F). Here, hydrofluoric acid is used as an etchant of the wet etching. Thereby, the third insulating film 105 can be etched, and at the same time, native oxide and others adhering to the surface of the p-type amorphous semiconductor layer 153 can be removed. Thereafter, the same steps as the steps shown in FIGS. 6Q to 6T in Embodiment 1 described above are carried out, whereby the imaging panel 1 is produced.

Embodiments of the imaging panel and the method for producing the same are described above, but the above-described embodiments are merely examples. The imaging panel and the method for producing the same, therefore, are not limited to the above-described embodiments, and the above-described embodiments can be appropriately varied and implemented without departing from the spirit and scope of the invention. The following description describes modification examples of the imaging panel.

(1) A treatment for removing native oxide and the like on the surface of the p-type amorphous semiconductor layer 153 with use of hydrofluoric acid may be carried out after the contact hole CH2 is formed in the step shown in FIG. 6P in Embodiments 1 and 2 described above, before the step shown in FIG. 6Q in which the metal film 141, which will become the upper electrode 14b, is formed. Further, in the step shown in FIG. 8E in Embodiment 3, and in the step shown in FIG. 9F in Embodiment 4, after the opening 105a in the third insulating film 105 is formed and before the step shown in FIG. 6Q, a treatment for removing native oxide and the like on the surface of the p-type amorphous semiconductor layer 153 with use of hydrofluoric acid may be carried out. By removing native oxide and the like adhering to the surface of the p-type amorphous semiconductor layer 153 with use of hydrofluoric acid in this way before the metal film 141 which will become the upper electrode 14b, is formed, better contact can be obtained between the p-type amorphous semiconductor layer 153 and the upper electrode 14b, which makes it possible to improve the performance of the device as an X-ray sensor. Incidentally, any etching agent containing hydrofluoric acid may be used as an etching agent used for removing native oxide.

(2) The above-described embodiments are described with reference to examples in which the protection film 17 is formed with a semiconductor film made of amorphous silicon, or an inorganic insulating film made of silicon nitride. The protection film 17, however, is not limited to these configurations, and any material may be used as long as the material is resistant against hydrofluoric acid. For example, the protection film 17 may be made of an impurity semiconductor (of n-type a-Si or p-type a-Si), or may be made of an oxide semiconductor (for example, In—Ga—Zn—O). Further, as an inorganic insulating film, the protection film 17 may be made of silicon oxide or silicon nitride oxide. Further, in the above-described embodiments, the configuration may be such that the side surfaces of the metal film 162 made of aluminum is covered with the metal film 163 made of molybdenum nitride (MoN), which is provided in the uppermost layer of the bias line 16.

(3) The materials used for forming the bias line 16 in the above-described embodiments are not limited to the materials used in the above-described embodiments. For example, either tungsten (W) or tantalum (Ta) may be used in place of molybdenum nitride (MoN) used in the bias line 16 in the embodiments. Further, either silver (Ag) or copper (Cu) may be used in place of aluminum (Al) contained in the bias line 16, or alternatively, a laminate of aluminum (Al) or copper (Cu), and molybdenum nitride (MoN), may be used. Still further, the bias line 16 may have a two-layer structure obtained by arranging any one of molybdenum nitride (MoN), tungsten (W), and tantalum (Ta) in the upper layer and arranging silver (Ag) in the lower layer.

The imaging panel and the method for producing the same thus described above may be also described as follows.

An imaging panel according to the first configuration includes: a substrate; a photoelectric conversion layer provided on a side of one of surfaces of the substrate; an electrode in contact with one of surfaces of the photoelectric conversion layer; a bias line connected with the electrode; and a protection film that is made of a material resistant against an etching agent containing hydrofluoric acid, and covers side surfaces of the bias line (the first configuration).

According to the first configuration, the electrode provided on one of the surfaces of the photoelectric conversion layer, and the bias line, are connected. The side surfaces of the bias line are covered with the protection film resistant against an etching agent containing hydrofluoric acid. The protection film makes it unlikely that the side surfaces of the bias line would be etched, even if the bias line is exposed to an acid in the imaging panel producing process. It is therefore unlikely that the bias line would have a high line resistance.

The first configuration may be further characterized in that the bias line is arranged at a position that does not overlap with the photoelectric conversion layer when viewed in a plan view (the second configuration).

According to the second configuration, the bias line is arranged at a position that does not overlap with the photoelectric conversion layer when viewed in a plan view. Therefore, the incidence of light to the photoelectric conversion layer is not hindered as compared with a case where the bias line is provided at a position that overlaps with the photoelectric conversion layer when viewed in a plan view, and this makes it possible to improve the quantum efficiency in the photoelectric conversion layer.

The first or second configuration may be further characterized in that the bias line is formed by laminating a plurality of metal films, and among the metal films, the metal film provided on the outermost surface is made of a material resistant against an etching agent containing the hydrofluoric acid (the third configuration).

According to the third configuration, the outermost surface of the bias line is formed with a metal film made of a material resistant against an etching agent containing hydrofluoric acid, in addition to the configuration in which the side surfaces of the bias line are covered with the protection film. It is therefore more unlikely that the bias line would be etched, even if the bias line is exposed to an etching agent containing hydrofluoric acid in the imaging panel producing process.

Any one of the first to third configurations may be further characterized in that the protection film is formed with a semiconductor material (the fourth configuration).

Any one of the first to third configurations may be further characterized in that the protection film is formed with an inorganic insulating film (the fifth configuration).

Any one of first to fifth configurations may be further characterized in that an insulating film that is provided over the photoelectric conversion layer so as to have an opening on the photoelectric conversion layer, wherein the electrode has translucency, and is in contact with the photoelectric conversion layer in the opening, and the bias line is provided in a layer upper with respect to the insulating film (the sixth configuration).

According to the sixth configuration, the electrode is connected with the photoelectric conversion layer through the opening in the insulating film provided on the photoelectric conversion layer. As the electrode has translucency, the incidence of light onto the photoelectric conversion layer is not hindered, even if the electrode is provided at a position that overlaps with the photoelectric conversion layer.

The first method for producing an imaging panel includes the steps of: forming a photoelectric conversion layer on a side of one of surfaces of a substrate; forming an electrode in contact with one of surfaces of the photoelectric conversion layer; forming a bias line connected with the electrode; and forming a protection film with a material resistant against an etching agent containing hydrofluoric acid, so that the protection film covers side surfaces of the bias line.

According to the first producing method, the electrode provided on one of the surfaces of the photoelectric conversion layer, and the bias line, are connected. The side surfaces of the bias line are covered with the protection film resistant against an etching agent containing hydrofluoric acid. The protection film therefore makes it unlikely that the side surfaces of the bias line would be etched, even if the bias line is exposed to an acid in the imaging panel producing process. It is therefore unlikely that the bias line would have a high line resistance.

The first producing method may be further characterized in that the step of forming the electrode is carried out after the step of forming the protection film, and the method further includes the step of performing a cleaning treatment with use of hydrofluoric acid so as to remove deposits on the surface of the photoelectric conversion layer, after the step of forming the protection film, and before the step of forming the electrode (the second producing method).

According to the second producing method, a cleaning treatment with use of hydrofluoric acid is carried out after the protection film is formed and before the electrode is formed, whereby deposits on the surface of the photoelectric conversion layer are removed. As compared with a case where no cleaning treatment is carried out, better contact can be therefore formed between the electrode and the photoelectric conversion layer.

The second producing method may be further characterized in further including, after forming the photoelectric conversion layer, the steps of: forming an insulating film so that the insulating film coves the photoelectric conversion layer; forming a first opening in the insulating film at a position that overlaps with the photoelectric conversion layer when viewed in a plan view; forming a flattening film so that the flattening film covers the insulating film; and forming a second opening in the flattening film at a position that overlaps with the first opening when viewed in a plan view, wherein the electrode is made of a conductive material having translucency, and is connected with the photoelectric conversion layer through the first opening and the second opening, and the bias line is made of a metal material on the flattening film at a position that does not overlap with the photoelectric conversion layer when viewed in a plan view (the third producing method).

According to the third producing method, the first opening in the insulating film and the second opening in the flattening film are formed at a position that overlaps with the photoelectric conversion layer when viewed in a plan view, and the photoelectric conversion layer and the electrode are connected through the first opening and the second opening. As the electrode is made of a material having translucency, it is unlikely that the incidence of light onto the photoelectric conversion layer would be hindered, even if the electrode is arranged at a position that overlaps with the photoelectric conversion layer when viewed in a plan view. Further, as the bias line made of a metal material is arranged on the flattening film at a position that does not overlap with the photoelectric conversion layer when viewed in a plan view, the bias line does not hinder the incidence of light onto the photoelectric conversion layer.

The third producing method may be further characterized in that the step of forming the first opening is carried out after the step of forming the protection film, before the step of forming the electrode, and the insulating film is etched with use of an etching agent containing hydrofluoric acid (the fourth producing method).

According to the fourth producing method, the first opening in the insulating film is formed after the protection film is formed and before the electrode is formed. In the etching carried out when the first opening is formed, hydrofluoric acid is used as an etchant. This makes it possible to remove deposits on the surface of the photoelectric conversion layer by the etching carried out when the first opening is formed, thereby forming better contact between the photoelectric conversion layer and the electrode.

The invention claimed is:

1. An imaging panel comprising:
a substrate;
a photoelectric conversion layer provided on a side of one of surfaces of the substrate;
an electrode in contact with one of surfaces of the photoelectric conversion layer;
a bias line connected with the electrode; and
a protection film that is made of a material resistant against an etching agent containing hydrofluoric acid,
wherein the bias line is arranged such that a whole portion of the bias line does not overlap with the photoelectric conversion layer when viewed in a plan view, and
the protection film covers side surfaces of the bias line and an upper surface of the bias line except a part of the upper surface where the bias line and the electrode are in contact with each other.

2. The imaging panel according to claim 1,
wherein the bias line is formed by laminating a plurality of metal films, and
among the metal films, the metal film provided on the outermost surface is made of a material resistant against the acid.

3. The imaging panel according to claim 1,
wherein the protection film is formed with a semiconductor material.

4. The imaging panel according to claim 1,
wherein the protection film is formed with an inorganic insulating film.

5. The imaging panel according to claim 1, further comprising:
an insulating film that is provided over the photoelectric conversion layer so as to have an opening on the photoelectric conversion layer,
wherein the electrode has translucency, and is in contact with the photoelectric conversion layer in the opening, and
the bias line is provided in a layer upper with respect to the insulating film.

* * * * *